United States Patent
Lal et al.

(10) Patent No.: US 9,867,272 B2
(45) Date of Patent: Jan. 9, 2018

(54) GENERATION AND ACCELERATION OF CHARGED PARTICLES USING COMPACT DEVICES AND SYSTEMS

(71) Applicant: Cornell University, Ithaca, NY (US)

(72) Inventors: Amit Lal, Ithaca, NY (US); Yue Shi, Santa Clara, CA (US); Serhan Ardanuc, Ithaca, NY (US); June-Ho Hwang, Ithaca, NY (US); Farhan Rana, Ithaca, NY (US)

(73) Assignee: Cornell University, Ithaca, NY (US)

( * ) Notice: Subject to any disclaimer, the term of this patent is extended or adjusted under 35 U.S.C. 154(b) by 53 days.

(21) Appl. No.: 14/436,859

(22) PCT Filed: Oct. 17, 2013

(86) PCT No.: PCT/US2013/065549
  § 371 (c)(1),
  (2) Date: Apr. 17, 2015

(87) PCT Pub. No.: WO2014/123591
  PCT Pub. Date: Aug. 14, 2014

(65) Prior Publication Data
  US 2016/0174355 A1   Jun. 16, 2016

Related U.S. Application Data

(60) Provisional application No. 61/715,144, filed on Oct. 17, 2012, provisional application No. 61/715,225, filed on Oct. 17, 2012.

(51) Int. Cl.
  *H05H 7/04*  (2006.01)
  *H05H 9/04*  (2006.01)
  (Continued)

(52) U.S. Cl.
  CPC ............. *H05H 9/045* (2013.01); *H01J 37/06* (2013.01); *H01J 37/1472* (2013.01); *H05H 7/04* (2013.01);
  (Continued)

(58) Field of Classification Search
  None
  See application file for complete search history.

(56) References Cited

U.S. PATENT DOCUMENTS 5,311,566 A * 5/1994 Curry ..................... A62D 3/174
                                              250/253
5,401,973 A * 3/1995 McKeown .......... H05H 1/0006
                                              250/396 R (Continued)

OTHER PUBLICATIONS

International Search Report and Written Opinion of PCT/US2013/065549 dated Aug. 22, 2014, by the Korean Intellectual Property Office (13 pages).

*Primary Examiner* — Douglas W Owens
*Assistant Examiner* — Srinivas Sathiraju
(74) *Attorney, Agent, or Firm* — Perkins Coie LLP

(57) ABSTRACT

A system that generates short charged particle packets or pulses (e.g., electron packets) without requiring a fast-switching-laser source is described. This system may include a charged particle source that produces a stream of continuous charged particles to propagate along a charged particle path. The system also includes a charged particle deflector positioned in the charged particle path to deflect the stream of continuous charged particles to a set of directions different from the charged particle path. The system additionally includes a series of beam blockers located downstream from the charged particle deflector and spaced from one another in a linear configuration as a beam-blocker grating. This beam-blocker grating can interact with the deflected stream of charged particles and divide the stream (Continued)

of the charged particles into a set of short particle packets. In one embodiment, the charged particles are electrons. The beam blockers can be conductors.

22 Claims, 24 Drawing Sheets

(51) Int. Cl.
H01J 37/06 (2006.01)
H01J 37/147 (2006.01)

(52) U.S. Cl.
CPC ........ H05H 9/042 (2013.01); *H01J 2237/063* (2013.01); *H01J 2237/15* (2013.01); *H05H 2007/043* (2013.01); *H05H 2007/046* (2013.01)

(56) References Cited

U.S. PATENT DOCUMENTS

| | | | | |
|---|---|---|---|---|
| 5,434,420 A * | 7/1995 | McKeown | ........... | H05H 1/0006 250/396 R |
| 5,451,794 A * | 9/1995 | McKeown | ........... | H05H 1/0006 250/397 |
| 5,744,919 A * | 4/1998 | Mishin | .................. | H05H 9/00 315/500 |
| 5,814,940 A * | 9/1998 | Fujisawa | ............... | H05H 9/00 315/5.41 |
| 5,994,708 A * | 11/1999 | Nakasuji | ............... | B82Y 10/00 250/398 |
| 6,060,833 A * | 5/2000 | Velazco | ................. | H05H 7/16 315/5.41 |
| 6,320,334 B1 * | 11/2001 | Roberge | ............... | H01J 37/304 250/492.2 |
| 6,326,746 B1 * | 12/2001 | Chen | .................... | H05H 9/00 315/5.41 |
| 6,462,489 B1 * | 10/2002 | Roberge | ............... | H01J 37/304 315/362 |
| 7,005,669 B1 * | 2/2006 | Lee | ....................... | B82Y 10/00 257/14 |
| 7,259,373 B2 * | 8/2007 | Zani | ..................... | B82Y 10/00 204/192.11 |
| 7,426,067 B1 * | 9/2008 | Bright | ................... | B81B 3/0005 359/223.1 |
| 7,466,085 B2 * | 12/2008 | Nutt | ...................... | H05H 13/00 250/291 |
| 7,488,960 B2 * | 2/2009 | Zani | ..................... | B82Y 10/00 216/66 |
| 7,495,242 B2 * | 2/2009 | Zani | ..................... | B82Y 10/00 204/192.11 |
| 7,495,244 B2 * | 2/2009 | Zani | ..................... | B82Y 10/00 204/192.11 |
| 7,495,245 B2 * | 2/2009 | Zani | ..................... | B82Y 10/00 204/192.11 |
| 7,501,644 B2 * | 3/2009 | Zani | ..................... | B82Y 10/00 250/309 |
| 7,507,960 B2 * | 3/2009 | Zani | ..................... | B82Y 10/00 216/66 |
| 7,541,905 B2 * | 6/2009 | Antaya | ................... | H05H 7/04 313/62 |
| 7,553,686 B2 * | 6/2009 | George | ................. | B81B 3/0005 359/223.1 |
| 7,576,499 B2 * | 8/2009 | Caporaso | ................ | H05H 9/02 315/500 |
| 7,656,258 B1 * | 2/2010 | Antaya | ................... | H01F 6/00 313/62 |
| 7,659,526 B2 * | 2/2010 | Zani | ..................... | B82Y 10/00 250/309 |
| 8,598,813 B2 * | 12/2013 | Joshkin | ................ | H05H 9/005 307/106 |
| 8,927,950 B2 * | 1/2015 | Gall | ...................... | A61N 5/1077 250/492.1 |
| 9,301,384 B2 * | 3/2016 | Zwart | | |
| 2004/0126072 A1 * | 7/2004 | Hoon Lee | ............. | B82Y 10/00 385/122 |
| 2006/0255268 A1 * | 11/2006 | Frosien | ................. | B82Y 10/00 250/310 |
| 2007/0138980 A1 * | 6/2007 | Sanders | ................... | H05H 7/00 315/505 |
| 2007/0278428 A1 * | 12/2007 | Zani | ..................... | B82Y 10/00 250/492.22 |
| 2007/0284527 A1 * | 12/2007 | Zani | ..................... | B82Y 10/00 250/309 |
| 2007/0284537 A1 * | 12/2007 | Zani | ..................... | B82Y 10/00 250/398 |
| 2007/0284538 A1 * | 12/2007 | Zani | ..................... | B82Y 10/00 250/398 |
| 2007/0284695 A1 * | 12/2007 | Zani | ..................... | B82Y 10/00 257/607 |
| 2008/0219297 A1 * | 9/2008 | Yamada | ................... | H01S 4/00 372/5 |
| 2008/0258653 A1 * | 10/2008 | Nutt | ...................... | H05H 13/00 315/502 |
| 2009/0218520 A1 * | 9/2009 | Nutt | ...................... | G21G 1/0005 250/493.1 |
| 2009/0224700 A1 * | 9/2009 | Chen | ....................... | H05H 9/00 315/505 |
| 2010/0032580 A1 * | 2/2010 | Caporaso | ................ | H01J 27/26 250/396 R |
| 2012/0112323 A1 * | 5/2012 | Zani | ..................... | B82Y 10/00 257/618 |
| 2012/0235603 A1 * | 9/2012 | Heid | ...................... | H05H 9/00 315/505 |
| 2013/0106316 A1 * | 5/2013 | Caporaso | ............... | H05H 9/005 315/506 |
| 2013/0140468 A1 * | 6/2013 | Chen | ....................... | H01J 3/26 250/396 R |
| 2014/0049193 A1 * | 2/2014 | Hailey | ................... | H05H 7/06 315/506 |

* cited by examiner

*Fig. 2 Electron beam tracking simulations in Einzel focusing, for a) various $V_{Einzel}$ for constant $A/D=1$; b) various Einzel $A/D$, constant $V_{Einzel}=500V$; c) cascaded Einzel with same $V_{Einzel}$ and total length.*
*Focal lengths follows*
$$\frac{f_2}{f_1} = \sqrt{\frac{V_2}{V_1}}$$

GENERATION AND ACCELERATION OF CHARGED PARTICLES USING COMPACT DEVICES AND SYSTEMS

PRIORITY CLAIM AND RELATED PATENT APPLICATIONS

This patent document is a 35 USC §371 National Stage application of International Application No. PCT/US2013/065549 filed Oct. 17, 2013, which claims the benefit of (1) U.S. Provisional Application No. 61/715,144 entitled "GENERATION OF SHORT-CHARGED PARTICLE PACKETS AND COHERENT ELECTROMAGNETIC PULSES USING LINEAR CONDUCTOR GRATINGS" and filed Oct. 17, 2012, and (2) U.S. Provisional Application No. 61/715,225 entitled "COPLANAR WAVEGUIDE RESONANT CHARGED PARTICLE ACCELERATOR" and filed Oct. 17, 2012, the disclosures of which are incorporated by reference as part of the specification of this document.

STATEMENT OF GOVERNMENT SUPPORT

This invention was made with government support under Grant No. N66001-11-1-4201 awarded by the Defense Advanced Research Projects Agency (DARPA). The government has certain rights in this invention.

BACKGROUND

This patent document relates to generation of charged particle pulses such as electron pulses and uses of such charged particle pulses in various applications, including terahertz-wave generation and time-resolved microscopy. In addition, This patent document relates to linear charged particle accelerators which accelerate charged particles to have desired particle energy or speed for various applications.

SUMMARY

This patent document provides techniques, devices and systems that generate short charged particle packets or pulses of charged particles, e.g., electron packets. Certain implementations of the disclosed technology may be configured to achieve one or more advantages or benefits, including, e.g., providing charged particle generators without requiring a fast-switching-laser source.

In one aspect, a device for generating charged particle packets or pulses is described. This device includes a charged particle deflector for receiving a stream of continuous charged particles propagating along a first direction. The charged particle deflector is operable to deflect the stream of continuous charged particles to a set of directions different from the first direction. The device also includes a series of beam blockers located downstream from the charged particle deflector and spaced from one another in a periodic or with spacing designed for appropriate timing, linear or slightly angled configuration as a series of impediments for the electron beam to propagate. This array of beam blockers can interact with the deflected stream of charged particles and divide the stream of the charged particles into a set of short particle packets. In one embodiment, the charged particles are electrons. In some embodiments, the duration of the short particle packets is of sub-picosecond. Further, the charged particle deflector can be configured with a ramp voltage applied across the pair of electrodes, wherein the ramp voltage causes the continuous electron beam passing through the charged particle deflector to sweep across the array of beam blockers.

In another aspect, a system for generating charged particle packets or pulses is described. This system includes a charged particle source that produces a stream of continuous charged particles to propagate along a charged particle path. The system also includes a charged particle deflector positioned in the charged particle path to deflect the stream of continuous charged particles to a set of directions different from the charged particle path. The system additionally includes a series of beam blockers located downstream from the charged particle deflector and spaced from one another in a linear configuration as a beam-blocker grating. This beam-blocker grating can interact with the deflected stream of charged particles and divide the stream of the charged particles into a set of short particle packets. In one embodiment, the charged particles are electrons. In some embodiments, the duration of the short particle packets is of sub-picosecond to a few femtoseconds. In some embodiments, the beam blockers are conductors. Further, the charged particle deflector can be configured with a ramp voltage applied across the pair of electrodes, wherein the ramp voltage causes the continuous electron beam passing through the charged particle deflector to sweep across the array of beam blockers.

In another aspect, a compact linear charged particle accelerator (LINAC) for accelerating charged particles is described. This compact LINAC includes a radio frequency (RF) signal generator for generating an RF signal. The compact LINAC also includes an RF resonator coupled to the RF signal generator and operable to generate a high-voltage RF drive signal based on the received RF signal. The compact LINAC further includes a linear series of electrode segments coupled to the RF resonator and configured to pass and accelerate charged particles successively through a channel of the linear series of electrode segments, wherein each electrode segment of the linear series of electrode segments is driven by the high-voltage RF drive signal. In some embodiments, the RF resonator is implemented as a coplanar waveguide.

In yet another aspect, a co-planar linear charged particle accelerator is described to include a planar platform; and coplanar waveguide resonators formed on the planar platform as RF cavities to achieve high voltages at a particle path defined by the coplanar waveguide resonators for accelerating charged particles. The coplanar waveguide resonators formed on the planar platform may include multiple layers of coplanar waveguide resonators. The planar platform may include a printed circuit board and wire bonds that are electrically coupled to the coplanar waveguide resonators.

Those and other aspects, their implementations and advantages are described in greater detail in the drawings, the description and the claims.

Figure 1:
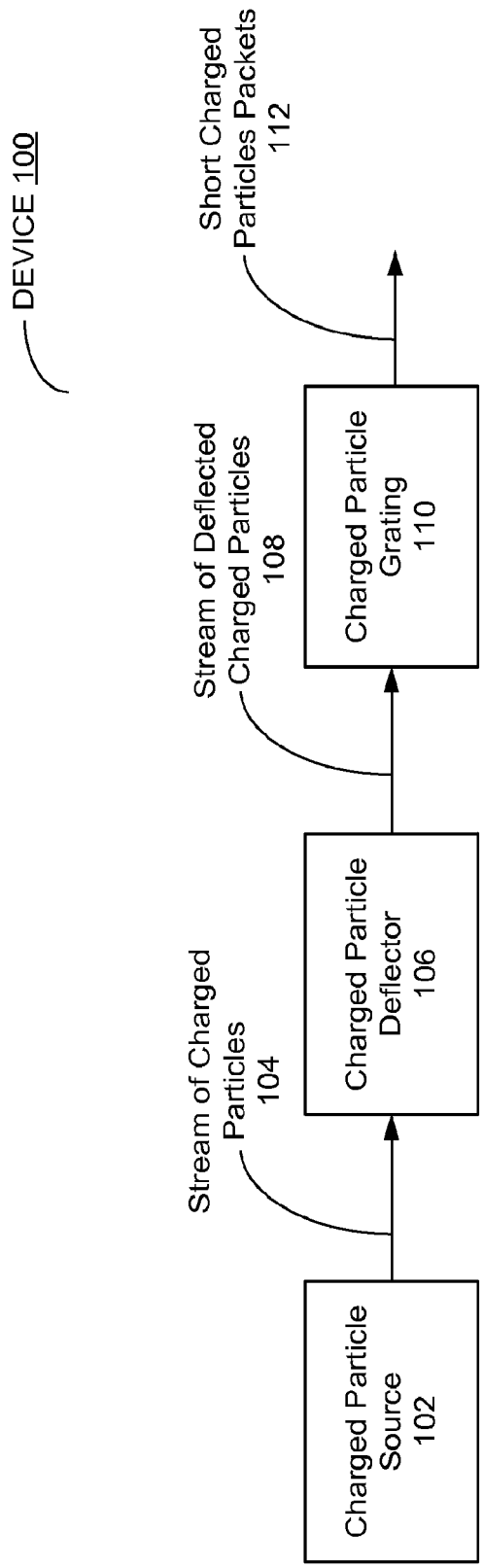
FIG. 1 illustrates a block-diagram of an exemplary device for generating charged particle packets or pulses in accordance with some embodiments described herein.

Table 1 presents listing of parameters used in the analytical calculations of the base case study in accordance with some embodiments described herein.

Table 2 presents a parameter summary of multiple and single slit experiments in accordance with some embodiments described herein.

DETAILED DESCRIPTION

Generation of charged particle pulses, e.g., electron pulses, with durations on the order of femtoseconds to picoseconds has applications in the study of molecular and atomic interactions via time-resolved pump-probe techniques as well as ultrafast electron diffraction. Traditionally, ultrafast lasers with femtosecond pulse durations can be used to generate short electron packets. However, such ultrafast lasers tend to be expensive, may suffer performance issues and usually require complex maintenance.

This patent document provides techniques, devices and systems that generate short charged particle packets or pulses (e.g., electron packets) without expensive ultrafast lasers and disclosed implementations can be used to provide a knife-edge sampling technique by using linear arrays of beam blockers, such as conductor gratings to generate electron packets with short packet durations, e.g., on the order of femtoseconds to picoseconds.

In various applications using charged particle beams, either in form of continuous wave charged particle beams or pulsed charged particle beams with charged particle packets, the energy or speed of the charged particles may need increased by using linear charged particle accelerators. Many forms and structures of particle accelerators exist, such as the LINear particle ACcelerator (LINAC), Synchrotron, and Cyclotron. However, many of the existing particle accelerators are heavy and bulky by using permanent magnets, power supplies, and cooling systems to generate high electromagnetic fields to accelerate particles. Charged particle acceleration could also be achieved with the use of pyro-electric crystals to produce an accelerating field. Although this method could potentially realize small sized devices, the crystals must be heated and is limited in the amount of field produced, and hence limited acceleration. Wake fields induced by femto-second lasers have also been shown to produce intense accelerating electric fields in plasma. However, similar to other systems that require lasers, the size and power consumption of the wake fields system cannot be easily reduced.

LINAC is a type of oscillating field accelerator, which uses alternating high electric fields to accelerate the particles along a straight line. Typically, the higher the energy of the particle is accelerated to, the longer the length of the LINAC is required. In fact the famous high energy LINAC at SLAC National Accelerator Laboratory is 3.2 km long. LINACs with lower energy targets have also been produced, but these LINACs are disadvantaged because of their larger size compared to other low-energy-target accelerators.

The LINAC designs in this patent document can be implemented by using RF resonators that, at certain resonant frequencies, enhance the voltage oscillation intensity with a gain proportional to the quality factor (Q-factor) of the resonator. As an example, if the input peak-peak voltage oscillation is 70V for an input power of 50 W, then the traditional LINAC design without the present RF resonator designs usually produces a peak voltage around 70V. The RF resonator designs in this document with a large Q (e.g., 100) can produce a resulting voltage intensity around 7000V. The disclosed technology can be used to construct coplanar waveguide resonators as RF cavities to achieve high voltages. The coplanar waveguides enable low-profile accelerators comparable to the height of silicon-cascaded accelerators structures. Such accelerators can be cascaded on top of each other for high density charged particle manipulation. Such designs can be implemented by configuring the LINAC and RF resonator in planar technology and thus can be integrated easily with other electronics. In addition, certain fabrication processes or techniques involved in such planar technology, e.g. PCB patterning and Si microsculpting, are well characterized and developed.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made.

Ultrafast lasers with femtosecond pulse durations can be used to generate short electron packets. Such ultrafast lasers tend to be expensive, may suffer performance issues and usually require complex maintenance. This patent document provides examples of techniques, devices and systems that generate short charged particle packets or pulses (e.g., electron packets) without using ultra-fast lasers. The disclosed technology can be used to enable cost effective, compact size electron pulse generators for applications such as terahertz-wave generation, time-resolved microscopy, cathodoluminescence, and e-beam lithography.

Technical features described in this application can be used to enable a laser-free technique to generate short electron packets with durations on the order of femtoseconds to picoseconds. An analytical model is provided that describes the electron dynamics and estimates the duration between the packets. Generation of electron pulses with durations on the order of femtosecond to picoseconds can be used in applications in the study of molecular and atomic interactions via time-resolved pump-probe techniques as well as ultrafast electron diffraction. Additionally, terahertz wave generation, which has recently been a topic of increased interest, is possible through Smith-Purcell radiation. Various short-pulse charged particle generator examples are provided below based on a series of beam blockers (e.g., a series of conductors) arranged to form a linear beam-blocker grating along the path of the charged particles.

For example, one exemplary generator for generating charged particle packets or pulses includes a charged particle source that produces a stream of charged particles to propagate along a charged particle path; a charged particle deflector in the charged particle path to deflect the charged particles; and a series of conductors located downstream from the charged particle deflector and spaced from one another in a linear configuration as a conductor grating along the charged particle path to interact with the deflected charged particles to divide the stream of the charged particles into short particle packets. Another exemplary generator for generating coherent electromagnetic pulses of charged particles includes a charged particle source that produces a stream of charged particles to propagate along a charged particle path; and a series of beam blockers spaced from one another in a linear configuration (such as a periodic configuration) as a conductor grating along the electron path to interact the stream of electrons to induce electrical currents on the conductors to cause electromagnetic radiation pulses from the induced electrical currents on the conductors, wherein the conductors are arranged in a way that far fields of electromagnetic radiation from the conductors are coherently added to form a coherent electromagnetic pulse.

FIG. 1 illustrates a block-diagram of an exemplary device 100 for generating charged particle packets or pulses in accordance with some embodiments described herein. As can be seen in FIG. 1, device 100 comprise a charged particle source 102 that produces a stream of charged particles 104 which propagates along a charged particle path. A charged particle deflector 106 of device 100 is positioned in the charged particle path to deflect the stream of charged particles 104 and outputs a stream of deflected charged particles 108. Device 100 further includes a charged particle grating 110 positioned along the charged particle path and downstream from charged particle deflector 106. Charged particle grating 110 interacts with the stream of deflected charged particles 108 and divides the stream of the charged particles 108 into short charged particle packets 112 as the output of charged particle grating 110. In some embodiments, charged particle grating 110 comprises a series of beam blockers located and spaced from one another in a linear configuration as an orifice array. In one embodiment, the series of beam blockers is arranged in a direction which is substantially along the charged particle path. In the invention described herein, the orifice array, is placed in the same direction as the beam, creating a much faster sweep velocity across the orifices than if the orifices, as a small sweep angle leads to a wide sweep across the array. In some embodiments, the series of beam blockers is a set of conductors.

Figure 2:
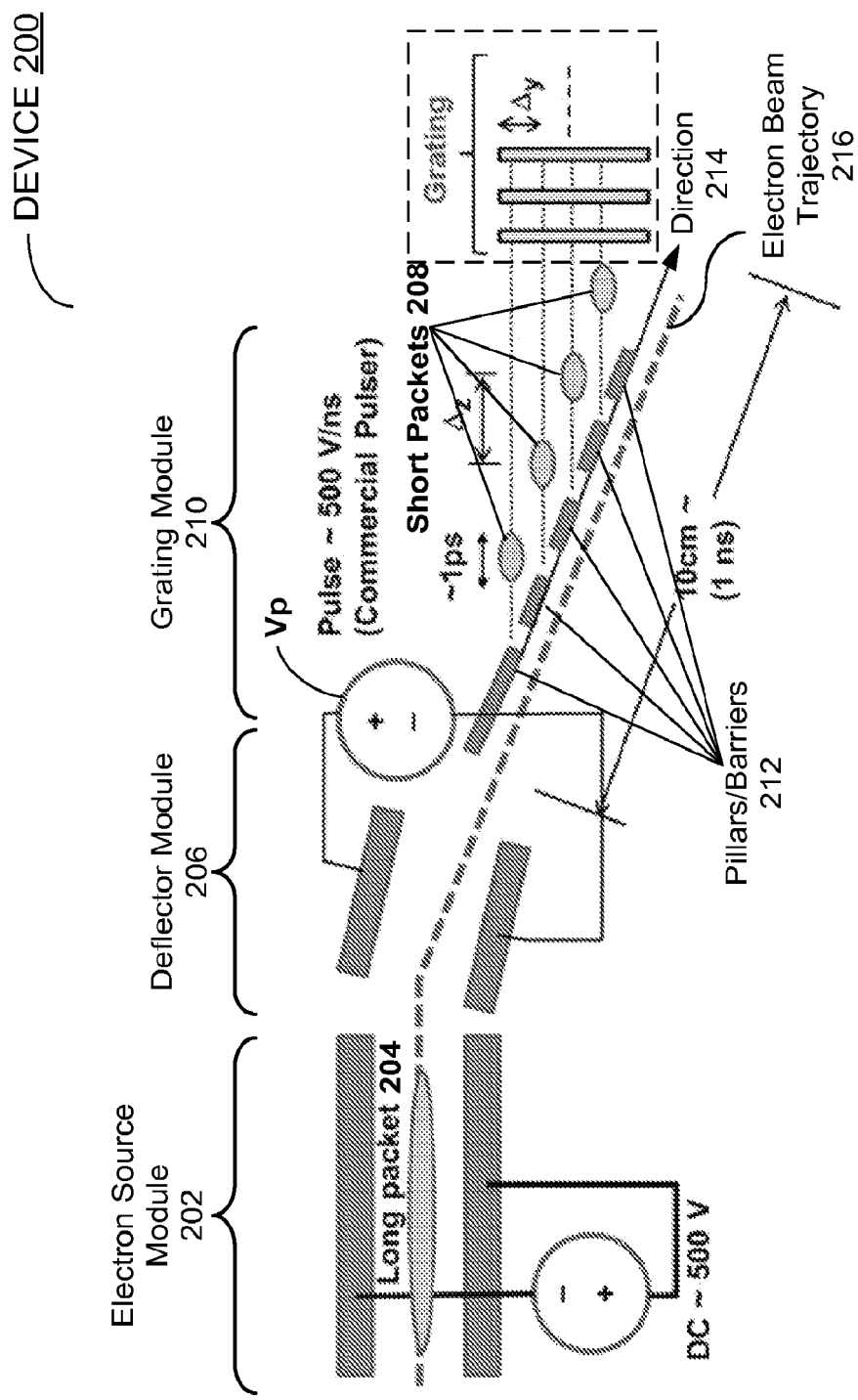
FIG. 2 illustrates a schematic of an exemplary device for generating short electron packets by implementing a knife-edge sampling technique in the charged particle grating of device 100 in accordance with some embodiments described herein.

FIG. 2 illustrates a schematic of an exemplary device 200 for generating short electron packets by implementing a knife-edge sampling technique in the charged particle grating 110 of device 100 in accordance with some embodiments described herein. In this example, the exemplary device includes three modules: an electron source module 202 which corresponds to charged particle source 102 in device 100, an electrostatic deflector module 206 which corresponds to charged particle deflector 106 in device 100, and a grating module 210 which corresponds to charged particle grating 110 in device 100. Note that grating module 210 forms a drift region for the charged particles. Although device 200 and exemplary systems and techniques hereinafter are described in the context of the electrons, the present invention can generally be used for any type of charged particles (either negatively charged or positively charged), not just electrons.

As shown in FIG. 2, electron source module 202 can produce a continuous-wave (CW) or a long-duration electron packet 204 that is introduced to the downstream electrostatic deflector module 206. In the embodiment shown, electrostatic deflector module 206 comprises two parallel plate electrodes with a ramp voltage $V_p$ applied across the two electrodes. The ramped deflector voltage $V_p$ causes the continuous electron beam passing through deflector module 206 to sweep across a grating module 210. In some embodiments, electrostatic deflector module 206 may also include a first-level static-voltage deflector stage positioned before the ramp-voltage deflector stage, so that charged particles pass through both the static-voltage deflector stage and the ramp-voltage deflector stage.

Note that grating module 210 comprises a series of pillars/barriers 212 located downstream from deflector module 206 and spaced from one another in a periodic linear configuration. Hence, the series of pillars/barriers 212 forms a "grating" of alternating apertures/slits and pillars/barriers. In one embodiment, the series of pillars/barriers 212 is made of electrically conductive material, i.e., conductors. Note that each of the series of pillars/barriers can be of a rectangular cuboid shape, but can also be of cylinder, trapezoidal prism or other shapes. As the deflected continuous electron beam sweeps over grating module 210, the grid-like boundary acts like multiple knife-edges that divides the incoming electron beam into short length electron packets 208. The duration of the short packets 208 and the distance between the packets may be based on the voltage ramp rate and also the grating configurations, and more details are provided below. In some embodiments, the apertures/slits in the grid-like boundary are very narrow in the direction of the electron beam sweeping to cause short duration electron bunches to be generated through such small aperture dimensions. In some implementations, the system parameters are arranged in such a way that the electron packets cause a coherent Smith-Purcell radiation as they pass over the grating.

While grating module 210 shown in FIG. 2 includes multiple apertures/slits, other embodiments of the grating module can include a single aperture/slit. Note also that the series of pillars/barriers 212 is arranged along a direction 214 which is substantially parallel to, or at a small angle with respect to the initial undeflected electron beam trajectory 216. Hence, when the deflection voltage is applied, the deflected electron beam can reach any of the pillars/barriers 212 in a much shorter time in comparison to the cases when the undeflected electron beam trajectory 216 form a larger angle with respect to direction 214. Consequently, the configuration of device 200 facilitates reducing the duration between successive electrode packets produced by grating module 210. The inset in FIG. 2 also provides a side-view of grating module 210. As can be seen in the inset, grating module 210 comprises an array of alternating pillars and slits.

Figure 3:
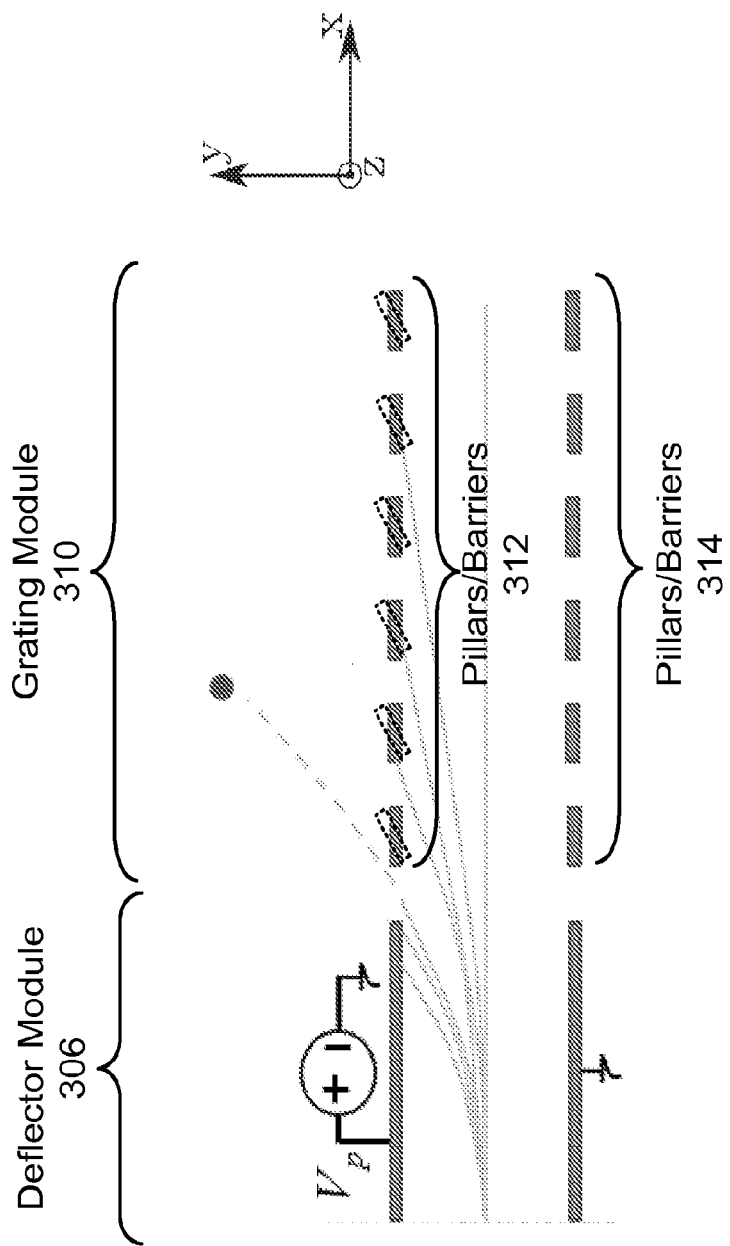
FIG. 3 illustrates an electron-packet generation process by sweeping a continuous electron beam across a deflector module and a grating module in accordance with some embodiments described herein.

FIG. 3 illustrates an electron-packet generation process by sweeping a continuous electron beam across deflector module 306 and grating module 310 in accordance with some embodiments described herein. As illustrated in FIG. 3, grating module 310 is formed by a first set of pillars/barriers 312 and a second set of pillars/barriers 314 opposing the first set of pillars/barriers 312. In one embodiments, all the pillars/barriers 312 and pillars/barriers 314 are conductors and all are connected to the same potential, e.g., the ground. As such, the region/space between pillars/barriers 312 and pillars/barriers 314 is electromagnetically shielded and is referred to as the "drift region" for the electrons entering the space. Note that while FIG. 3 shows that all the pillars in a set of pillars 312 or 314 are arranged along the x-direction, other embodiments can have the pillars arranged at an angle with respect to the x-direction, as indicated by the set of dashed-line boxes over the set of pillars/barriers 312.

As the electrons pass through the deflecting region between deflector module 206, they experience an electric field (in the y-direction) perpendicular to their initial velocity (in the x-direction), thereby attaining a transverse velocity component that sweeps them across one or more pillar boundaries. The pillars will stop the beam and act like shutters to produce packets of electrons. The duration of the electron packets and charge density may be determined by the width and length of the deflector module 206, the deflector ramp voltage $V_p$, and the dimension of the pillars, among other parameters. Note that the electron packets emanating the grating travel in different directions. In some embodiments, a set of electrodes may be positioned outside of the grating module 310 in the paths of the emanated electron packets to correct the initial paths so that these electron packets travel substantially in the same direction. Note also that ramp voltage $V_p$ can be repeated at a desired repetition rate for generating a periodic source of charged-particle-packets trains.

The following sections provide analysis of electron dynamics in an electron packet generator which uses the knife-edge sampling technique based on the exemplary electron-packet generating device 200.

Figure 4:
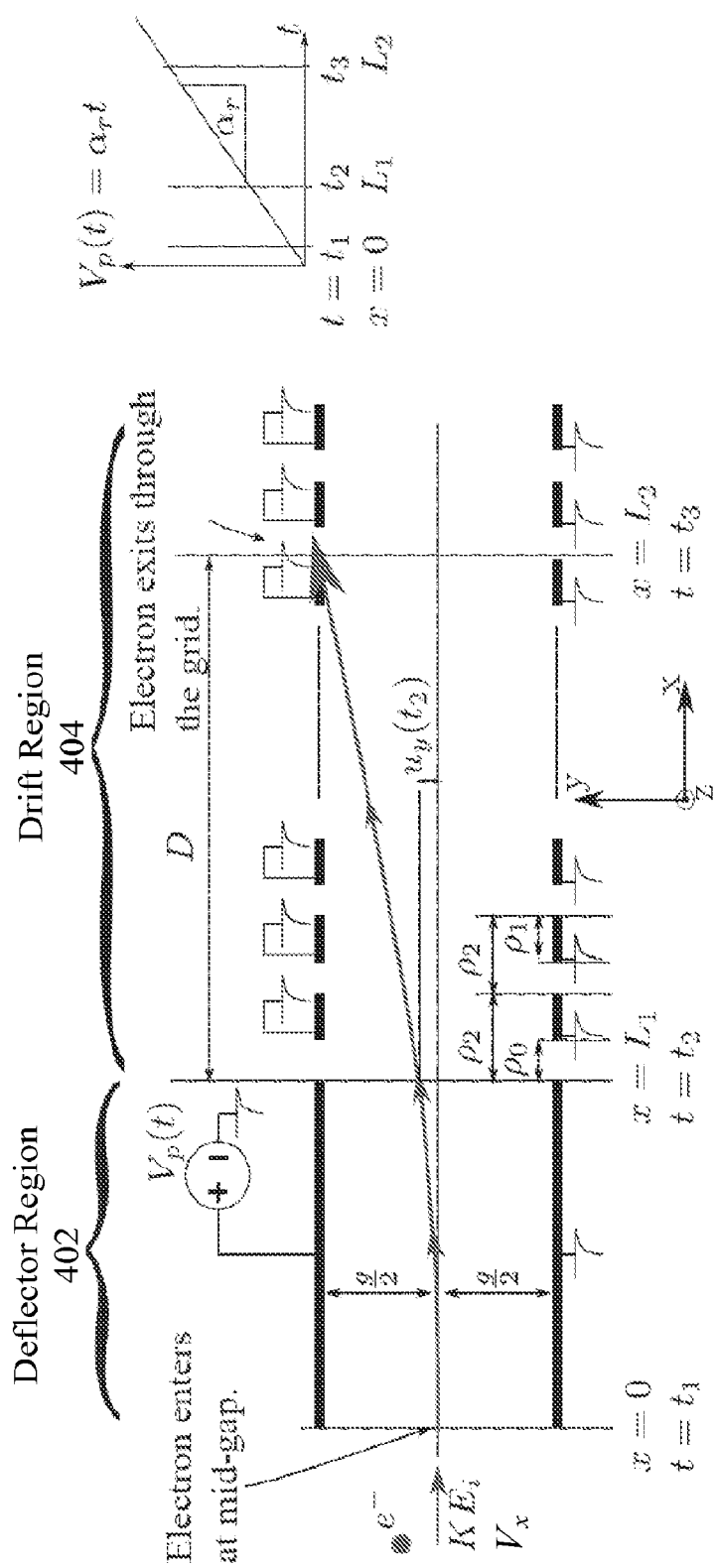
FIG. 4 illustrates a schematic of the electron-packet generating device 200 and the operation principle of the proposed knife-edge sampling technique for generating short electron packets from a long-duration or continuous electron beam in accordance with some embodiments described herein.

FIG. 4 illustrates a schematic of electron-packet generating device 200 and the operation principle of the proposed knife-edge sampling technique for generating short electron packets from a long-duration or continuous electron beam in accordance with some embodiments described herein. In this analysis, a continuous beam or a long packet of electrons with initial x-velocity, $V_x$, and kinetic energy, $KE_i$ is assumed to enter into the gap between the deflector electrodes at time $t_1$. These electrons travel through an electrostatic deflector region 402 formed by a parallel plate electrode pair driven by ramp voltage $V_p$. While the electrons without any deflector voltage typically travel straight through the drift region, electrons that are subjected to the ramp voltage in deflector region 402 obtain a vertical velocity component through deflector region 402.

In the successive drift region 404 formed by two opposing sets of conductors all coupled to the ground, electrons which move along a linear trajectory either are stopped by the pillars/barriers located at one set of positions in the boundary of the drift region or exit through openings located at the other set of positions in the boundary of the drift region. Moreover, the voltage ramp causes the electrons to sweep across the boundary, which results in the modulation of the initially continuous beam causing short electron packets to emanate from the drift region. The spatial and temporal distribution of the election packets are dictated by multiple parameters including, but are not limited to the length of the deflector, gap between the deflector plates, pillar/grid spacing, and initial electron energy $KE_i$, and horizontal sweep velocity of electrons across the grid-like boundary of the drift region. Again, note that the deflector region 402 and drift region 404 are configured such that the initial undeflected electron beam trajectory is substantially parallel to the center line of drift region 404, i.e., the direction of periodic linear configuration of the grating.

The electron dynamics in this exemplary implementation may be understood by the following analysis. The time spent by the electrons in the deflector region is associated with the length of the deflector region divided by the initial horizontal velocity $V_x$. $V_x$ is assumed to be constant due to lack of horizontally acting forces. The gap between the deflector electrodes is labeled as g, and the electrons enter the deflector near the center of the gap, with initial separation of g/2 from either electrode. The position at the entrance of deflector electrodes, which has a length of $L_1$ (i.e., the length of the deflector region), is arbitrarily taken to be x=0. After being exposed to the electrostatic forces along y-direction, an electron exits the deflector region at $t=t_2$ and moves towards the boundary of the drift region over a linear trajectory. When $t=t_3$, the electron either exits out of the boundary through one of the openings spaced at a pitch of $\rho_2$ or is stopped by the periodic boundary elements that are $\rho_1$ long. At this point, electron moved a horizontal distance D from the end of the deflector region, making its x-position at the exit of the packet generator to be $x=L_2=L_1+D$. The time spent by the electrons in the deflector region, $\Delta_{t,gap}$, is given by Eq. 1. This equation uses normalized velocity, $\beta=V_x/c$, where c represents the speed of light.

$$\Delta_{t,gap} = t_2 - t_1 = \frac{L_1}{V_x} = \frac{L_1}{\beta c} \tag{1}$$

The voltage waveform applied across the deflector electrodes, $V_p(t)$ is a ramp function. If $\alpha_r$ is the rate of increase of voltage in V/s and t is the time measured with respect to the instant at which ramping has started, then $V_p(t)$ can be expressed as:

$$V_p(t) = \alpha_r t. \tag{2}$$

The inset in FIG. 4 plots a transient waveform of an exemplary ramp function $V_p(t)$ and also shows the times $t_1$, $t_2$, and $t_3$ at which the given electrode enters the deflector region, exits the deflector region, and exits the drift region, respectively.

Denoting the deflection of the electron along y-axis as $u_y(t)$ and its velocity as $v_y(t)=\dot{u}_y(t)$, the electrical force component along the y-direction in the deflector region can be written as in Eq. 3:

$$F_y(t) = \frac{V_p(t)q_e^+}{g} \text{ for } t_1 \leq t \leq t_2 \tag{3}$$

where $q_e^+$ is the elementary charge.

If the electron velocity along the y-direction remains small enough so that electron dynamics can still be approximated by classical laws, then the transverse acceleration $a_y$ of the electron in the above time interval can be calculated as:

$$a_y(t) = \dot{v}_y(t) = \frac{V_p(t)q_e^+}{gm_{0,e}} = \left(\frac{\alpha_r q_e^+}{gm_{0,e}}\right) t = \Gamma t \tag{4}$$

where $m_{0,e}$ denotes the rest mass of an electron, and $\Gamma$ (m/s³) is defined as:

$$\Gamma = \frac{\alpha_r q_e^+}{gm_{0,e}}. \tag{5}$$

The velocity of the electron along the y-direction at $t=t_2$ can be found based on:

$$V_y(t_2) - V_y(t_1) = \frac{\Gamma t^2}{2}\bigg|_{t=t_1}^{t=t_2} = \frac{\Gamma}{2}(t_2^2 - t_1^2). \tag{6}$$

Initially, the electron is assumed to have both zero velocity and displacement along y-direction, so $V_y(t_1)=u_y(t_1)=0$ and Eq. 6 can be simplified to:

$$V_y(t_2) = \frac{\Gamma}{2}(t_2^2 - t_1^2). \tag{7}$$

Furthermore, after integrating Eq. 2 twice, the y-displacement at the end of the deflector region, i.e., at $t=t_2$, can be found as:

$$u_y(t_2) = \Gamma\left(\frac{t_2^3 - t_1^2(3t_2 - 2t_1)}{6}\right). \tag{8}$$

By equating the total y-displacement above to half of the gap between the deflector electrodes, i.e., g/2, one can find the elapsed time from the exit of the deflector electrodes at $x=L_1$ and $t=t_2$ till the electron exits from the drift region or crashes into the boundary of the same at $x=L_2$ and $t=t_3$. Denoting this duration as $\Delta_{t,crash}=t_3-t_2$, and realizing that the total distance traveled by the electron in y-direction at $t_3$ is g/2 and $V_y(t)=V_y(t_2)$ for $t_2<t<t_3$, one can write Eq. 9.

$$\frac{g}{2} = u_y(t_2) + \Delta_{t,crash}V_y(t_2) \tag{9}$$

Using Eq. 7, Eq. 8, and Eq. 9, $\Delta_{t,crash}$ can be expressed as:

$$\Delta_{t,crash} = \frac{3g - \Gamma(t_2^3 - t_1^2(3t_2 - 2t_1))}{3\Gamma(t_2^2 - t_1^2)} = t_3 - t_2. \tag{10}$$

The distance D traveled by the electron during this time interval will be:

$$D = \Delta_{t,crash}V_x = L_2 - L_1. \tag{11}$$

Substituting Eq. 1 and Eq. 11 into Eq. 10, $\Delta_{t,crash}$ can be expressed as:

$$\Delta_{t,crash} = \frac{3g - \Gamma\Delta_{t,gap}^2(3t_1 + \Delta_{t,gap})}{3\Gamma\Delta_{t,gap}(2t_1 + \Delta_{t,gap})}. \tag{12}$$

To obtain the injection time, $t_1$ as a function of the drift region exit length, D, we can use Eq. 1, Eq. 10, Eq. 11, and Eq. 12 to solve $t_1$, $t_2$, and $t_3$ as follows:

$$t_1 = \frac{3g - \Gamma\Delta_{t,gap}^3 - 3\Gamma\Delta_{t,gap}^2\frac{D}{V_x}}{3\Gamma\Delta_{t,gap}\left(\Delta_{t,gap} + 2\frac{D}{V_x}\right)} \tag{13a}$$

$$t_2 = t_1 + \Delta_{t,gap} \tag{13b}$$

$$t_3 = t_2 + \Delta_{t,crash}. \tag{13c}$$

We now describe how to obtain shorter electron packets at the exit of the drift region. An important objective in the design of the electron-packet generator is to minimize the duration between successive electron packets coming out of the grid-like boundary of the drift region. Note that this duration can depend on the shape and orientation of the knife-shaped pillars in the grating, which can vary in angle, width, and location. Although the analysis in conjunction with FIG. 4 assumes that the pillars are parallel to the direction of the beam for its simplicity, different configurations of the pillars in their angle, width, and location can be used in the proposed device. While the duration of the electron packets also varies as a function of the point of emanation, the duration may be approximated by the ratio of the distance between two adjacent pillars to the horizontal sweep velocity, $V_{swp}$, of the beam over the pillars/slits at the point of emanation. Consequently, computation of $V_{swp}$ of the electrons across this boundary is needed. The following derivation illustrates some important steps.

Assuming both $V_x$ and $L_1$ are constant, we have $$V_{swp} = \frac{\partial D}{\partial t_3} = V_x \frac{\partial \Delta_{t,crash}}{\partial t_3} \tag{14}$$

and using Eq. 13, we get:

$$\frac{\partial t_3}{\partial t_1} = 1 + \frac{\partial \Delta_{t,crash}}{\partial t_1}. \tag{15}$$

The partial derivative on the right hand side of the above equation can be computed with some effort to be:

$$\frac{\partial \Delta_{t,crash}}{\partial t_1} = -\frac{(\Gamma \Delta_{t,gap}^3 + 6g)}{3\Gamma \Delta_{t,gap}(2t_1 + \Delta_{t,gap})^2} \tag{16}$$

The partial derivative of $\Delta_{t,crash}$ with respect to $t_3$ can be written with the help of Eq. 15 as:

$$\frac{\partial \Delta_{t,crash}}{\partial t_3} = \frac{\partial \Delta_{t,crash}}{\partial t_1}\frac{\partial t_1}{\partial t_3} = \frac{\partial \Delta_{t,crash}}{\partial t_1}\left(1 + \frac{\partial \Delta_{t,crash}}{\partial t_1}\right)^{-1} \tag{17}$$

Substituting Eq. 16 in Eq. 15 yields the following relatively simple expression for $$\frac{\partial \Delta_{t,crash}}{\partial t_3}:$$

$$\frac{\partial \Delta_{t,crash}}{\partial t_3} = -\frac{(\Gamma \Delta_{t,gap}^3 + 6g)}{H_1(t_1)}, \tag{18}$$

where $$H_1(t_1) = 2\Gamma \Delta_{t,gap}(6t_1^2 + 6t_1 \Delta_{t,gap} + \Delta_{t,gap}^2) - 6g. \tag{19}$$

Finally, the horizontal sweep velocity $V_{swp}$ of the electron can be obtained based on Eq. 18 and Eq. 14:

$$V_{swp} = V_x \frac{\partial \Delta_{t,crash}}{\partial t_3}. \tag{20}$$

With the sweep velocity computed, the duration between two consecutive electron packets $\tau$, can be obtained:

$$\tau = \frac{\rho_2}{V_{swp}} \tag{21}$$

where $\rho_2$ is the pitch length between the pillars as shown in FIG. 4. Since the sweep velocity will typically be larger for electrons with larger $V_x$, Eq. 21 implies that, as we increase the initial kinetic energy of the electrons, the duration between the ejected pulses will decrease. Moreover, decreasing the gap and pillar pitch distance will also reduce the duration between the electron packets.

The above equations are used in a quantitative example for electrons with relativistic initial energies. Important parameters of this case study are listed below in Table 1.

TABLE 1

Listing of parameters used in the analytical calculations of the base case study

| Parameter | Symbol | Value | Unit |
| --- | --- | --- | --- |
| Deflector region voltage ramp rate | $\alpha_r$ | 1000 | V/ns |
| Normalized speed | $\beta$ | 2/3 | — |
| Initial kinetic energy of the electrons | $KE_i$ | 147.9 | keV |
| Gap between deflector electrodes | g | 1 | mm |
| Length of the deflector electrodes | $L_1$ | 3 | mm |
| Time spent in the deflector region | $\Delta_{t,gap}$ | 15 | ps |
| Drift region boundary grid pitch length | $\rho_2$ | 200 | μm |

Figure 5:
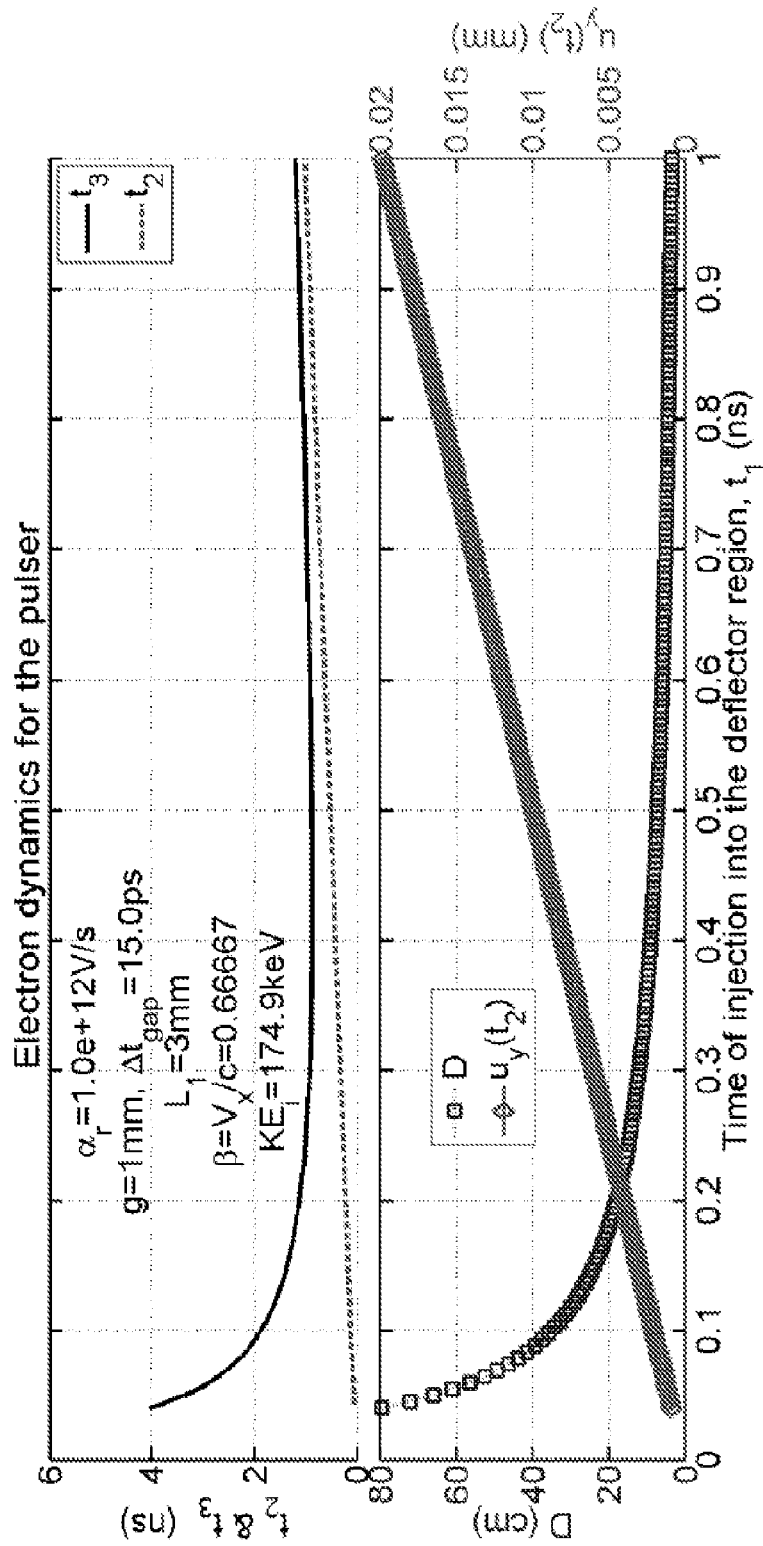
FIG. 5 shows plots of $t_2$, $t_3$, $u_y$ ($t_2$) and D as a function of the time of injection into the deflector electrodes, $t_1$ based on Eq. 13a, Eq. 8, and Eq. 11 in accordance with some embodiments described herein.

FIG. 5 shows plots of $t_2$, $t_3$, $u_y(t_2)$ and D as a function of the time of injection into the deflector electrodes, $t_1$ based on Eq. 13a, Eq. 8, and Eq. 11 in accordance with some embodiments described herein. As shown in FIG. 5, D, the distance travelled by the charged particles decreases as a function of the injection time, $t_1$, because the particle experiences higher voltage regions of the ramp function in the deflector region. Also note that, $t_3$ has a minima as a function of $t_1$, indicating the time at which the first particles hit the boundary of the drift region, either being obstructed by a pillar or emanating off this region.

Figure 6:
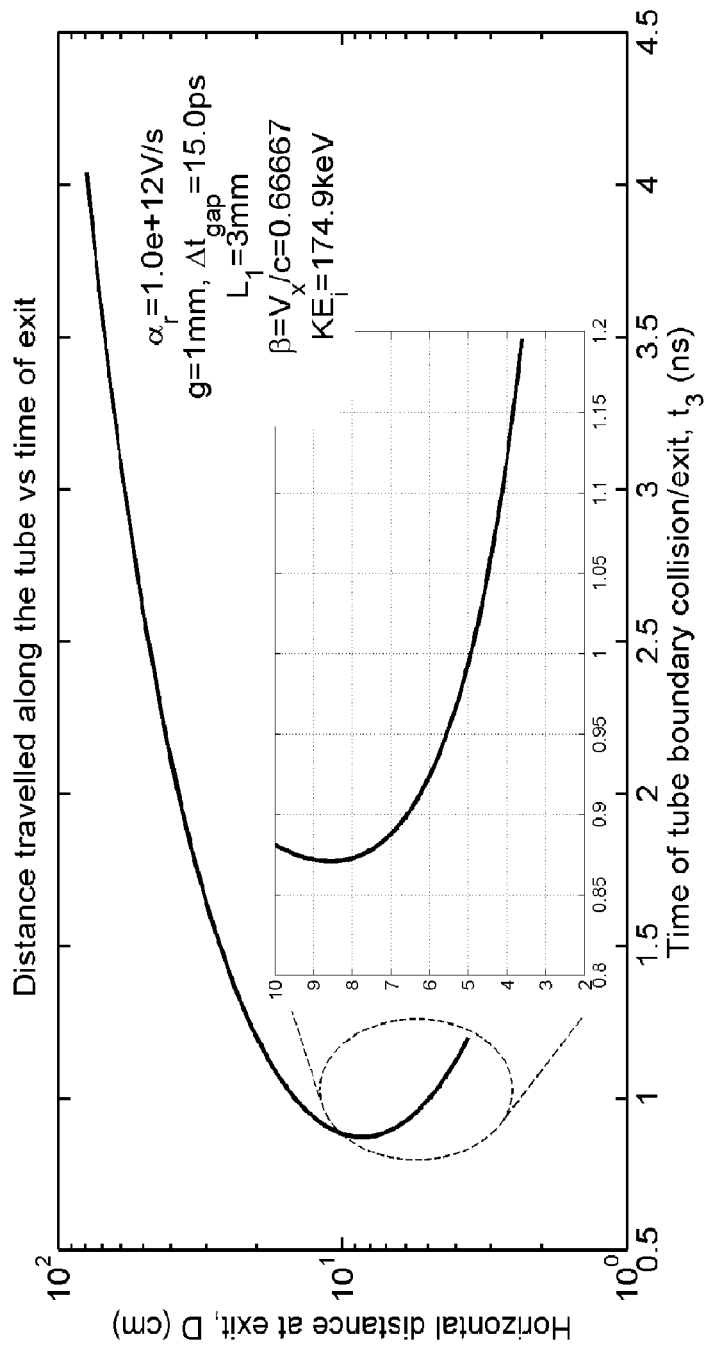
FIG. 6 shows a plot of the horizontal distance (D) traveled by an electron inside the drift region before exiting as a function of the time at which the exit occurs ($t_3$) in accordance with some embodiments described herein.

Referring back to FIG. 4, note that for a continuous beam of injected electrons, the electron-packet generator shown in FIG. 4 can be operated as a last-in-first-out system. In other words, the electrons that enter into the deflector region later (i.e., $t_1$ relatively large), exit before the electrons that entered into the deflector region at earlier times (i.e., $t_1$ relatively small). This is possible because the later electrons are subject to larger deflecting fields, which would allow them to exit the boundary of the system earlier. FIG. 6 shows a plot of the horizontal distance (D) traveled by an electron inside the drift region before exiting as a function of the time at which the exit occurs ($t_3$) in accordance with some embodiments described herein.

In the embodiment shown in FIG. 6, the inset shows the zoomed in version of the distance (D) traveled by an electron inside the drift region before exiting, as a function of the time at which the exit occurs ($t_3$), 0.8 ns<$t_3$<1.2 ns. Note that for small $t_3$, presence of two values for D indicates electrons reaching at two locations at the same time. While the zoomed in region of the plot, i.e., below the vertex of the rotated parabola-like curve, corresponds to first-in-first-out operation, the rest of the characteristic corresponds to last-in-first-out operation. Note however that the drift region has to be sufficiently long to support the last-in-first-out operation. In summary, the operation modality of the device (first-in-last-out or first-in-first out) can be controlled with device parameters.

It can also be noted from FIG. 6 that, the two different regions separated by the vertex point of the characteristic, has different polarity of $V_{swp}$, as calculated by Eq. 14. In the first-in-first-out characteristic zoomed in the inset, distance (D) traveled by an electron inside the drift tube decreases for electrons emanating the drift region at a later time. On the other hand, in the remaining first-in-last out region, distance (D) traveled by an electron inside the drift tube increases for electrons emanating the drift region at a later time. First-in-last-out or first-in-first-out regions can also be identified from the slope of the $t_3$ vs $t_1$ curve shown in FIG. 5.

Figure 7:
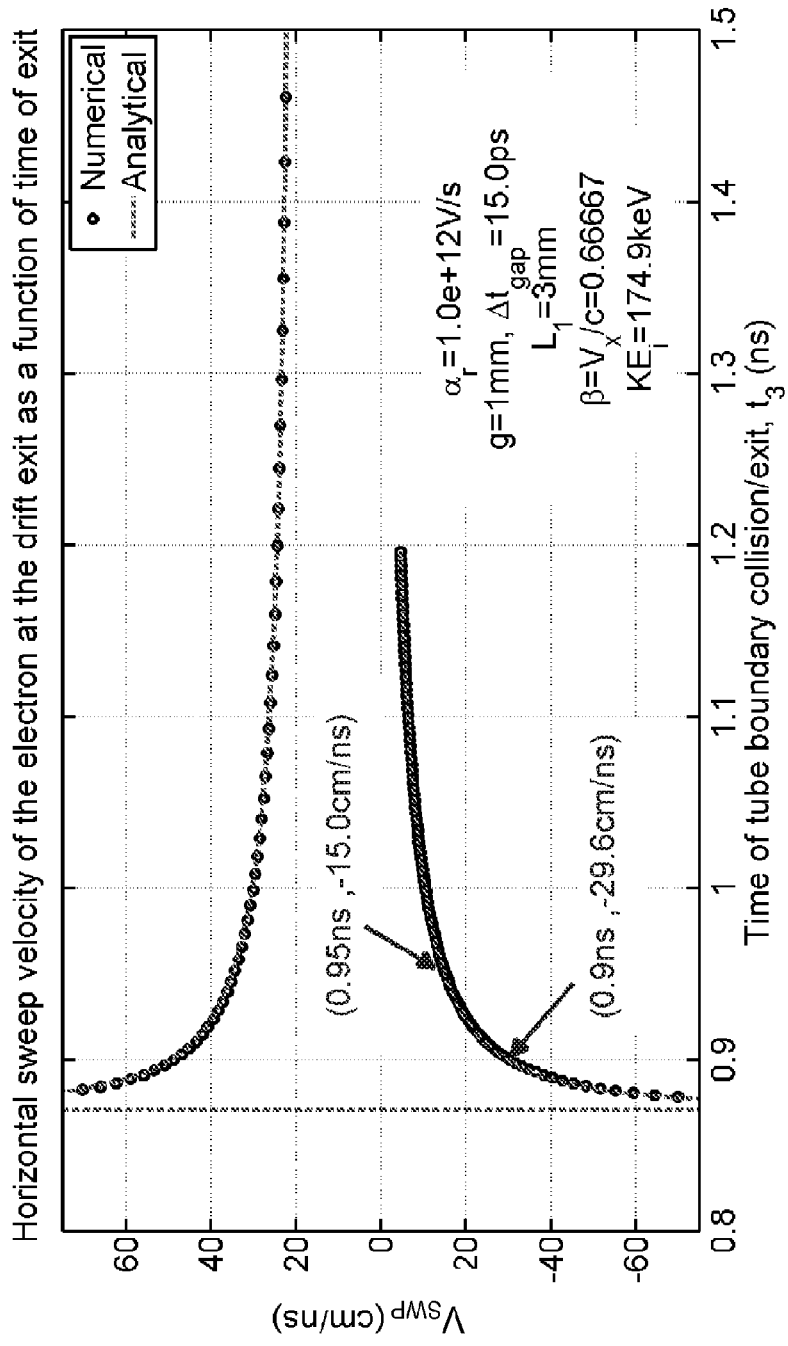
FIG. 7 shows a plot of horizontal sweep velocity $V_{swp}$ along the boundary of the drift region as a function of the time of exit $t_3$ in accordance with some embodiments described herein.

Slope of the curve in FIG. 6, which is $\partial D/\partial t_3$, can be calculated to estimate $V_{swp}$, in light of Eq. 14. For example, FIG. 7 shows a plot of horizontal sweep velocity $V_{swp}$ along the boundary of the drift region as a function of the time of exit $t_3$ in accordance with some embodiments described herein. Note that both the numerical derivative of the curve in FIG. 6 and the analytical calculation based on Eq. 20 are plotted in FIG. 7, and a good match between the two approaches can be observed.

The computed values of $V_{swp}$ in FIG. 7 includes both positive and negative sweep velocities. For example, the negative $V_{swp}$ values go from in excess of 30 cm/ns in amplitude at $t_3$=0.9 ns and decreases steeply as the time progresses, reaching 15 cm/ns in amplitude at $t_3$=0.95 ns. The average time interval between pulses can be calculated with the help of Eq. 21 assuming an conservative sweep velocity of $V_{swp}$=22 cm/ns in this range:

$$\tau = \frac{200 \ \mu m}{22 \ cm/ns} \approx 930 \ fs.$$

Consequently, the derived analytical model predicts subpicosecond electron pulses for the analyzed relativistic basecase.

While the electron-packet generator in conjunction with FIGS. 2-4 can be configured as a last-in-first-out system as described above, in some embodiments, the electron-packet generators in this disclosure can be configured as first-in-first-out systems, such that the electrons that enter into the deflector region earlier (i.e., $t_1$ relatively small), exit before the electrons that entered into the deflector region at later times (i.e., $t_1$ relatively large). This can be achieved by adjusting geometrical parameters of the embodiment or properly selected ramp voltage $V_p(t)$ applied across the deflector electrodes, among other things.

For preliminary experiments, an electron-pulse generating device (or a "pulse-generating device") was designed and fabricated by laser-cutting FR4 PC-boards with a commercially available instrument, LPKF ProtoLaser U. Custom laser micromachining recipes have been developed to pattern and cut thick FR-4 PC-boards and silicon substrates at a resolution of 100-200 μm with wall roughness of 10 μm. After laser cutting, the pieces were assembled to realize high aspect ratio 3D structures.

For the experiments of the pulse-generating device, a Kimball Physics EMG-4212 electron gun was used at a pressure of $10^{-5}$ Torr. The beam initial electron energy was 2 keV for the multiple pillar experiment and 5 keV for the single slit experiment. Along with the fabrication and assembly, alignment of the device was important to the experiment. The beam, which had a diameter of 1 mm, has to pass through the cover hole of the deflector and make a parallel trajectory towards the deflector plates. In order to achieve precise alignment. A BeO plate was used to locate the position of the beam prior to installing the pulse-generating device. Once the location of the beam was confirmed by observing the light on the BeO disk, the actual pillar and the detector were then installed. In the multiple pillar experiment, the voltage of the deflector was manually incremented. For the single slit experiment, the deflector voltage was driven by a high-voltage pulser with repetition rates less than 200 Hz. Experimental parameters are summarized in Table 2 for both sets of experiments.

Figure 8:
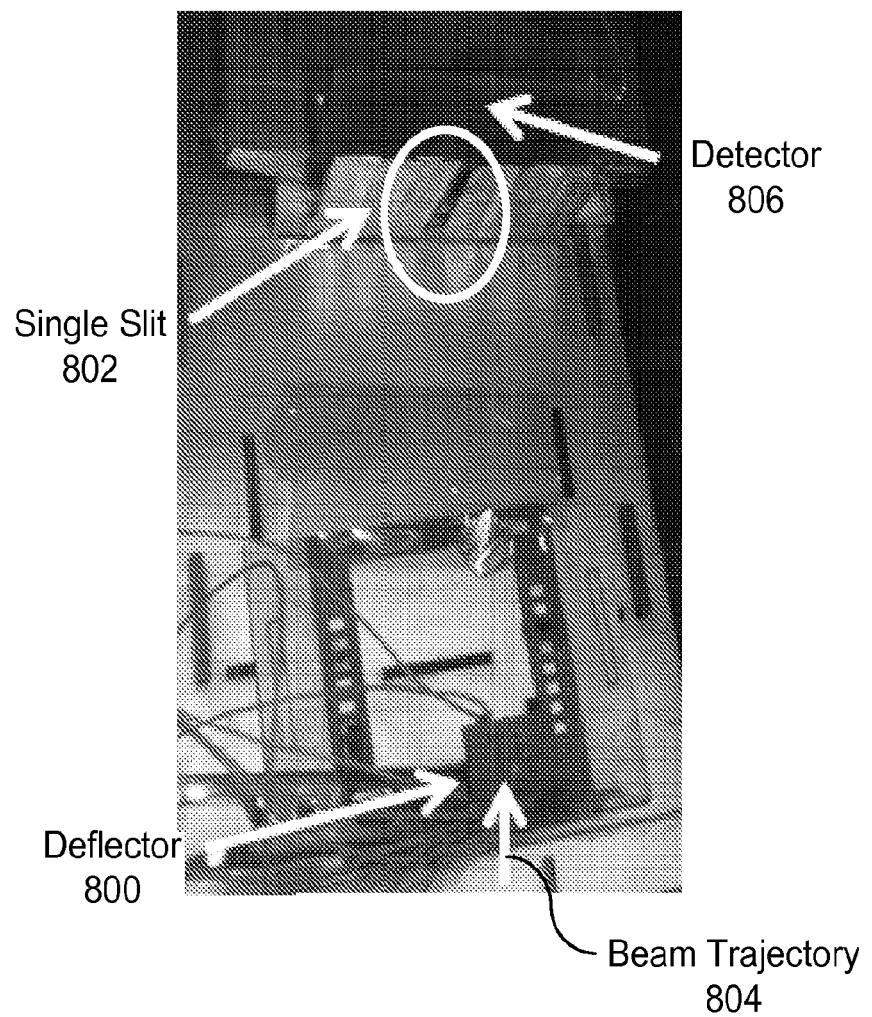
FIG. 8 shows a picture of the experimental setup for the single slit experiment in accordance with some embodiments described herein.

In a first set of experiments with the pulse-generating device, a single slit is tested as a knife-edge device to examine the current change on the detector plate. FIG. 8 shows a picture of the experimental setup for the single slit experiment in accordance with some embodiments described herein.

TABLE 2

Parameter summary of multiple and single slit experiments.

| | Multiple Slits | Single Slit |
|---|---|---|
| Length of Deflector | 3 mm | |
| Width of Pillars | 1.5 mm | |
| Gap of Deflector | 1 mm | |
| Number of Slits | 12 | 1 |
| Electron Energy | 2 keV | 5 keV |

In FIG. 8, the electron beam passes through the deflector 800 and is swept across a single slit 802 located at the top of the picture. The width of the single slit 802 is 1.5 mm and the injected electrons have an energy of 5 keV. Unlike the standard arrangement shown in FIG. 4, the pillars in the grating shown in FIG. 8 are placed at an angle to the initial undeflected beam trajectory 804. Once the electrons pass through the single slit, they hit the detector 806 which is located at the back of the single-slit grating, generating a peak voltage on the oscilloscope which are shown in FIG. 9.

Figure 9:
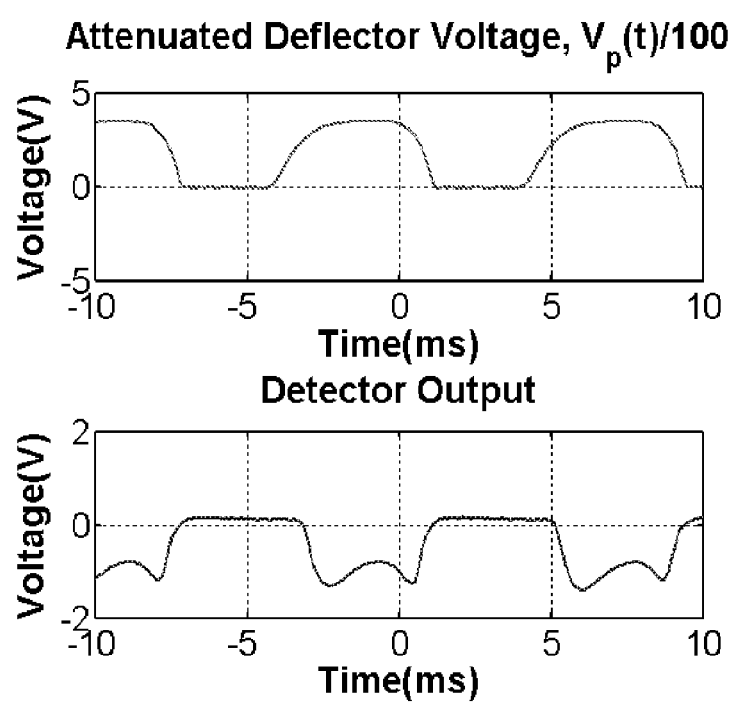
FIG. 9 shows plots of the deflector (scaled) and the detector voltage recorded simultaneously through an oscilloscope when the deflector electrodes were driven by a 400V signal at a repetition rate of 125 Hz by a pulser circuit in accordance with some embodiments described herein.

FIG. 9 plots the deflector 800 (scaled) and the detector 806 voltage recorded simultaneously through an oscilloscope when the deflector electrodes were driven by a 400V signal at a repetition rate of 125 Hz by a pulser circuit in accordance with some embodiments described herein. More specifically, the top plot in FIG. 9 represents the attenuated deflector 800 voltage and the bottom plot represents the detector 806 voltage. The rise and fall of the deflector voltage corresponds to a unique dip in the detector output. The energy of the electrons used for this experiment was 5 keV, the width of the slit was 1.5 mm, and the distance of the deflector to the slit was 7 cm. As the deflector voltage is increased to its maximum value, the electron beam sweeps across the single slit, and this is detected as a −1.5 V peak on the detector through an oscilloscope with a low-frequency input impedance of 1MΩ. After reaching its maximum value, the deflector voltage drops again to ground, producing another negative peak on the detector plate. Note that each rise and fall of the deflector voltage results in a negative peak in the detector output, yielding the expected frequency doubling effect.

Figure 10:
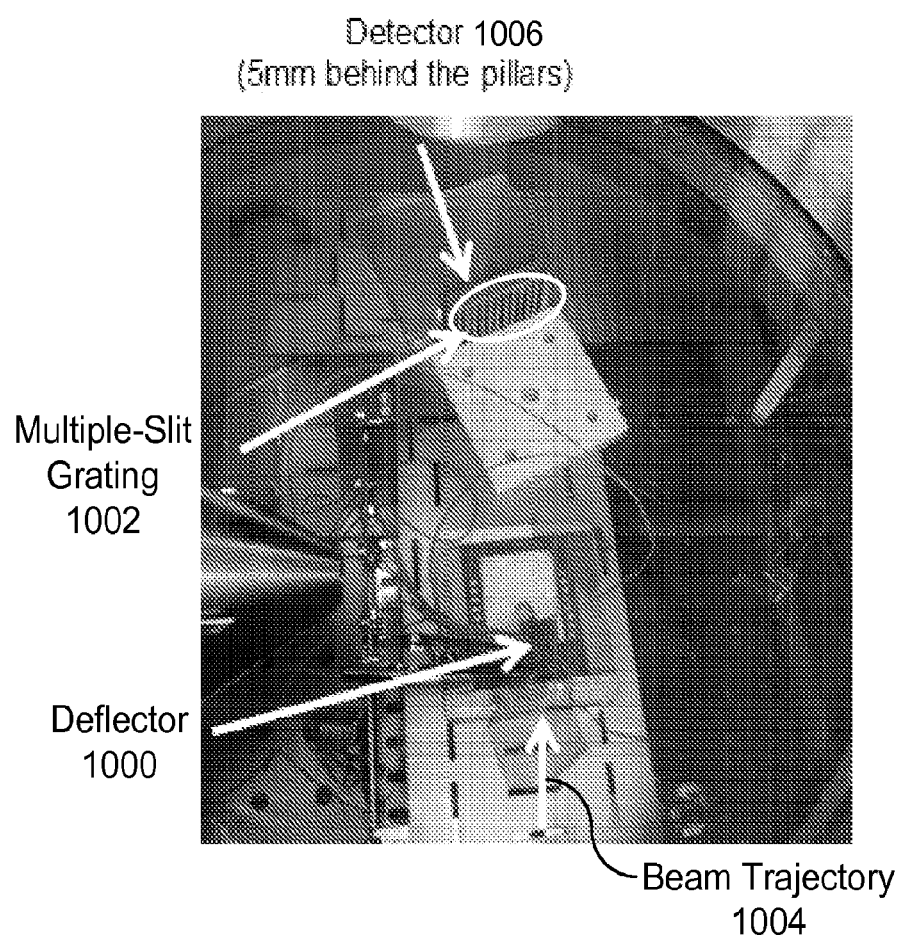
FIG. 10 shows a picture of the experimental setup inside the vacuum chamber for the multiple-slit grating experiment in accordance with some embodiments described herein.

In a second set of experiments with the pulse-generating device, a device with multiple-slit grating was used which was manufactured by way described above. FIG. 10 shows a picture of the experimental setup inside the vacuum chamber for the multiple-slit grating 1002 experiment in accordance with some embodiments described herein. The electron is injected from the bottom of the picture along an initial undeflected beam trajectory 1004 towards the top of the picture through the hole of the deflector 1000. In these experiments, 2 keV electrons are used instead of 5 keV electrons used in the first set of experiments. Pillar plate with 12 gratings was tested as a knife-edge device to examine the current change on the detector plate. In these experiments, the deflector 1000 voltage is driven by a DC source instead of a pulser. Before the deflector voltage source is turned on, the electron beam is initially blocked by the grounded pillar wall. As the deflector voltage is turned on and increased from 0 V to 480 V in steps of 10 V, the electron beam sweeps across the grid plate. This causes the modulation of the electron current incident on the detector 1006 behind multiple-slit grating 1002. This current is measured through a transimpedance amplifier with 1MΩ gain connected to an oscilloscope and is plotted in FIG. 11.

Figure 11:
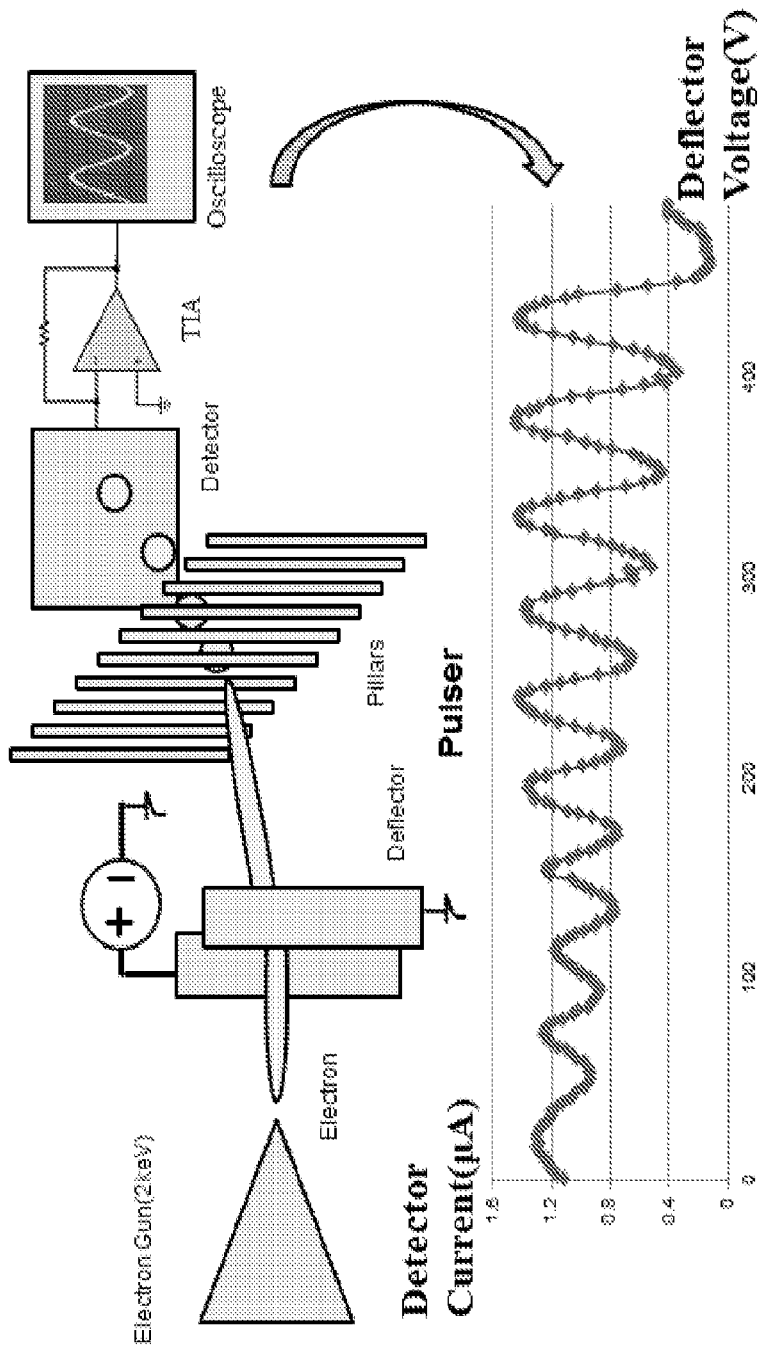
FIG. 11 shows the plot of measured current through a transimpedance amplifier with 1MΩ gain connected to an oscilloscope.

The top schematic in FIG. 11 represents the experimental setup. The bottom graph in FIG. 11 shows the current (μA) of the detector 1006 as the deflector 1000 voltage is increased from 0 V to 480 V. The current ranged from 0.1 μA to 1.4 μA with increasing peak to peak excursions as the deflector voltage is increased.

Figure 12:
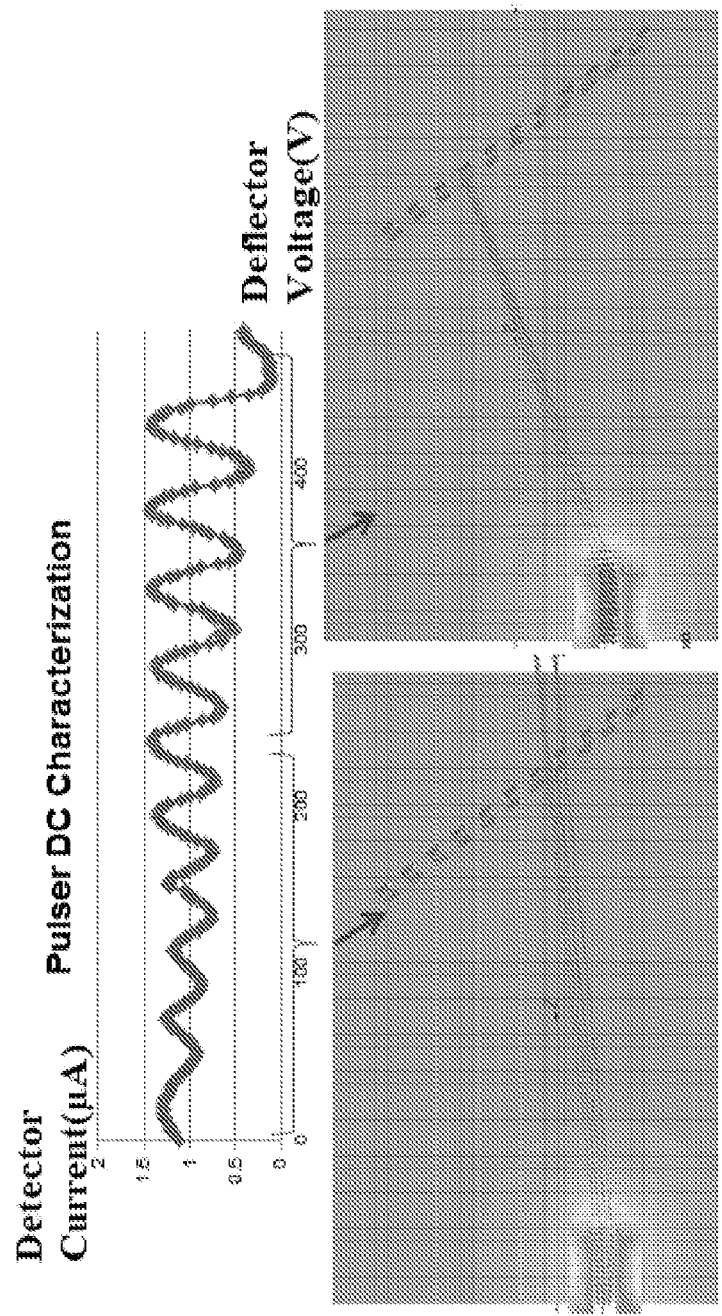
FIG. 12 shows the electron trajectories as simulated by a commercial ELM and particle tracing software (Opera™) in accordance with some embodiments described herein.

FIG. 12 shows the electron trajectories as simulated by a commercial FEM and particle tracing software (Opera™) in accordance with some embodiments described herein. Two cases of static deflector voltage are presented that result in electron incidence on the multiple-slit grating at different positions. The bottom two pictures show beam tracing simulation results of the multiple-slit experiments at low (left) and high (right) deflector voltages. Experimental data is also included on the top of the figure to highlight this association. Due to the configuration of the pillars in the multiple-slit grating, some of the beam passes through the pillar for low deflector voltages, but is blocked fully at larger deflector voltages.

Note that when the deflector voltage is low, which is the case for the left trajectory in FIG. 12, part of the electron packets pass through the grid due to beam width (specified to be 1 mm in diameter) being comparable/larger than the pillar cross-section. On the other hand, at larger deflection voltages, most of the beam is blocked by the pillar as a result of closer to perpendicular incidence on the beam as shown by the electron trajectories on the right of FIG. 12. This point may explain the gradual slope of increasing peak-to-peak current fluctuations that occur when the deflector voltage is increased as shown in FIG. 11. FIG. 12 highlights this fact by showing mappings between electron trajectories and the low/high-voltage ranges of the data of FIG. 11.

In conducted preliminary tests on a knife-edge pulse-generating device using a multiple-slit grating and a single slit, the minimum pulse duration observed may be limited by the bandwidth of the amplifier connected to the detector. Improvement of the amplifier bandwidth and positioning the preamplifier inside the vacuum chamber will enable detection of shorter pulse durations. A focused beam size is another important factor in generating short pulses. Hence, a chip-level Einzel lens can be incorporated before the deflector region to reduce the beam size and obtain a shorter pulse duration. Based on the above disclosed technology, in some implementations, an electron energy of 174.9 keV can be generated in electron packets by using a deflector gap of 1 mm, and a deflector voltage ramp rate of 1000 V/ns to achieve electron pulse durations shorter than 1 ps for a pillar pitch of 200 μm.

Implementations of a sub-picosecond electron pulse generator can be achieved without requiring a fast-switching-laser source. It is found that the minimum time duration between electron packets may be limited by the energy of the incoming continuous electron beam. A fast ramping high voltage supply can be used to minimize overall system dimensions, including the drift region through which electrons travel at constant velocity. Slow voltage ramps can also provide short pulses if there is sufficient flexibility on the length of the drift region.

The following sections disclose examples of coplanar waveguide resonant charged particle accelerators by using high-Q RF resonators to generate high-energy charged particles, such as high energy electron beams. Such high energy electron beams find many important applications such as in scanning electron microscopes, and electron lithography systems.

In some implementations, a linear particle accelerator (LINAC) is to accelerate a beam of charged particles by passing the particles through a linear series of electrode segments, each separated from each other by a small gap. The tubes are driven at radio frequency (RF) with each tube segment oscillating π out of phase with respect to the adjacent tube. This setup is designed such that the particle will arrive at the gaps between the tubes exactly when the potential difference between the 2 tubes is the highest, hence pushing the particle in the direction of motion to achieve the desired acceleration. As the energy (i.e., speed) of the particle increases, the length that it traverses in a period of RF oscillation increases, hence the lengths of the segments consecutively increase accordingly. The higher the energy of the beam accelerated to, the longer the length of the LINAC. Reducing the size of LINACs to a compact scale, and especially onto a planar substrate, can enable novel applications such as multiple-beam lithography and table top SEM.

Some embodiments described herein provide compact LINAC designs which can generate 10-1000 keV electrons with 1-50 μA beam current. In some embodiments, the proposed compact LINACs employs coplanar waveguide resonators as RF cavities to achieve high voltages. The coplanar waveguides enable low-profile accelerators comparable to the height of silicon wafer thickness, compatible with silicon-cascaded accelerators structures. Such accelerators can be cascaded on top of each other for high density charged particle manipulation. Moreover, some disclosed compact LINAC implementations provide an all integrated electric-field-only accelerator without energy inefficient, bulky equipment in other LINAC designs.

The proposed compact RF LINAC provides RF resonators that, at certain resonant frequencies, enhance the voltage oscillation intensity with a gain proportional to the quality factor (Q-factor) of the resonators. As an example, if the input peak-peak voltage oscillation is 70V for an input power of 50 W, then the peak voltage without the resonator is at most 70V. For the proposed design, with the addition of the resonator, the Q-factor being on the order of 100, the resulting voltage intensity can potentially be around 7000V. Moreover, some proposed LINACs and the associated RF resonator are constructed with planar technology which can be easily integrated with other electronics. We refer to the proposed compact coplanar-waveguide-resonator LINAC as "compact CPWR LINAC" or "CPWR LINAC" below.

Figure 13A:
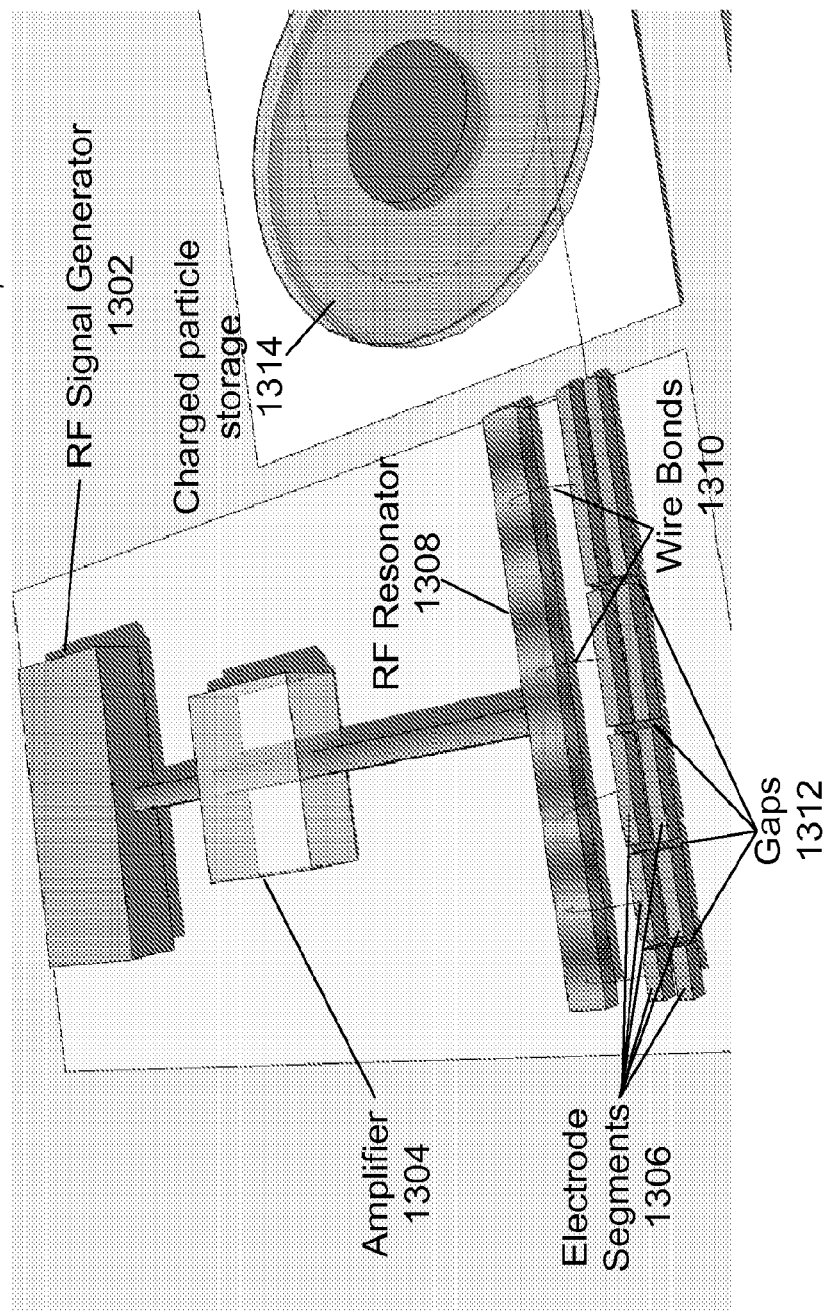
FIG. 13A illustrates a schematic of an exemplary compact coplanar-waveguide-resonator LINAC (CPWR LINAC) for accelerating charged particles in accordance with some embodiments described herein.

FIG. 13A illustrates a schematic of an exemplary CPWR LINAC 1300 for accelerating charged particles in accordance with some embodiments described herein. The CPWR LINAC 1300 includes an RF signal generator 1302 for generating an RF oscillation signal, an amplifier 1304 coupled to RF signal generator 1302 and operable to amplify the RF oscillation signal, and a linear series of electrode segments 1306 for accelerating charged particles. CPWR LINAC 1300 also includes an RF resonator 1308 which is coupled between the output of amplifier 1304 and electrode segments 1306, and operable to multiply the amplitude of the received RF oscillation signal by a large factor as a result of the resonant effect. The high peak-peak RF output from RF resonator 1308 is coupled to electrode segments 1306 through a set of wire bonds 1310 to provide the required drive signals. However, other implementations can replace wire bonds 1310 shown in FIG. 13A with other electrical coupling techniques to deliver drive signals to electrode segments 1306, such as using planar conductor wires or planar waveguides.

Note that the linear series of electrode segments 1306 serves the function of traditional drift tubes in a LINAC. However, the electrode segments 1306 are designed to have a much more compact size than traditional drift tubes which is enabled by micro-fabrication technologies. In some implementations, electrode segments 1306 are constructed with a planar structure using various wafer technologies. In the embodiment shown, each electrode segment in electrode segments 1306 comprises a pair of parallel electrode blocks, and the gap between the pair of electrode blocks forms the path or "channel" for the charged particles to traverse. Also different electrode segments have different lengths as required by the traditional drift tube theory. Hence, the charged particles will traverse electrode segments 1306 through the channel formed between the two linear row of electrode blocks. Note that a set of gaps 1312 is formed between different electrode segments. In one embodiment, electrode segments 1306 are driven by RF drive signals configured such that each electrode segment is driven π out of phase with respect to the adjacent electrode segment. This setup is designed such that the particle will arrive at the gaps 1312 between the electrode segments exactly when the potential difference between the 2 electrode segments is the highest, hence pushing the particle in the direction of movement to achieve the desired acceleration.

Figure 13B:
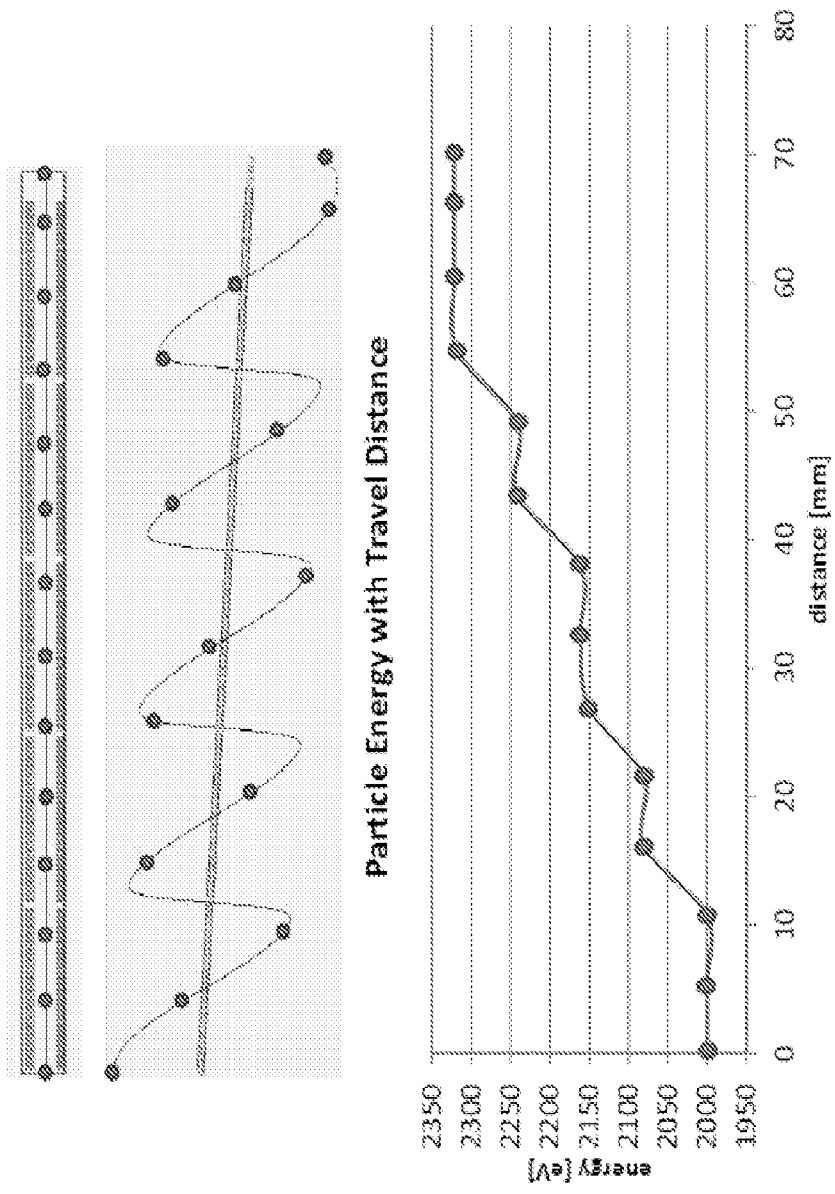
FIG. 13B presents simulation results of an exemplary CPWR LINAC design (Simion) in accordance with some embodiments described herein.

FIG. 13B presents simulation results of an exemplary CPWR LINAC design (Simion) in accordance with some embodiments described herein. The top graph in the figure shows that phases of the RF drive signal at different locations along the series of electrode segments. Note that the phase difference near the gaps of the electrode segments is the largest. The bottom graph in the figure shows the particle energy as a function of travel distance. The flat regions in the plot correspond to the movements within the electrode segments, whereas the "jumps" in energy correspond to the acceleration as the particle crosses the gaps between the electrode segments.

Note that the charged particles will enter electrode segments 1306 from the left hand side of electrode segments 1306 and exit from the right hand side of electrode segments 1306 after acceleration. The high-energy charged particles exiting electrode segments 1306 can enter a charged particle storage 1314 located on the right hand side of electrode segments 1306 and be temporarily stored for later use.

In the embodiment shown in FIG. 13A, RF resonator 1308 is constructed as a coplanar waveguide (CPW) using printed circuit board (PCB) technology. Hence, RF resonator 1308 can be implemented with different patterns and configurations, such as the linear pattern shown in FIG. 13A, or the meander pattern shown in FIGS. 14 and 17. Different waveguide configurations such as stripline, or floating back-electrode are possible to achieve different resonator configurations. Note that since both RF resonator 1308 and electrode segments 1306 can be micro-fabricated and can have compact sizes, they can be integrated on the same PCB-board to form a compact unit, thereby allowing a compact CPWR LINAC design. In one embodiment, both RF resonator 1308 and the linear series of electrode segments 1306 are formed on the same surface. FIG. 13A illustrates one example design for implementing the CPWR LINAC design, other configurations may also be possible. In some embodiments, micro-fabricated CPW RF resonators, such as RF resonator 1308 can be used together with tradition drift tubes instead of compact electrode segments 1306, which can still achieve certain size reduction in a LINAC design.

Figure 13C:
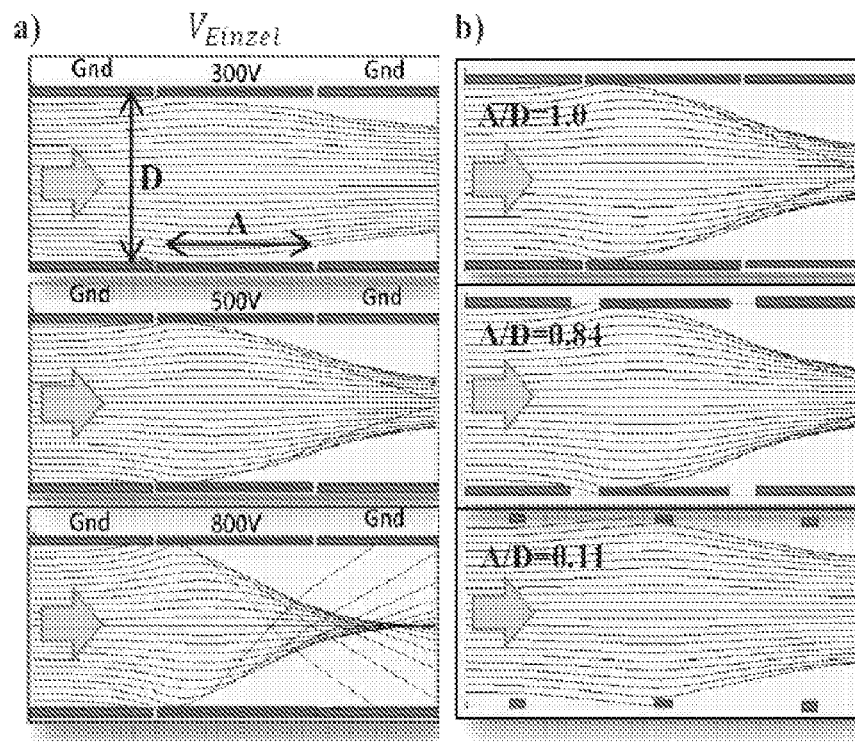
FIG. 13C shows particle beam focusing operation using $V_{Einzel}$ biased electrode segments in accordance with some embodiments described herein.
Figure 13C:
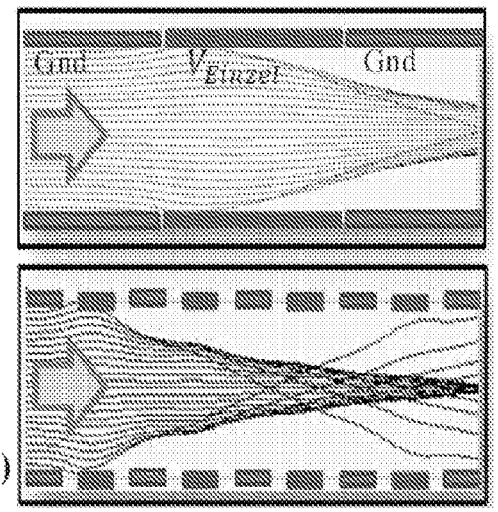

In the above discussion, it is assumed that the series of electrode segments 1306 are driven by RF signals for charged particle acceleration. In some embodiments however, electrode segments 1306 can be used as Einzel lens when biased with specific DC voltages (i.e., $V_{Einzel}$) for focusing charged particle beam as they travel through electrode segments 1306. FIG. 13C shows particle beam focusing operation using $V_{Einzel}$ biased electrode segments 1306 in accordance with some embodiments described herein. Subplot (a) in FIG. 13C shows various $V_{Einzel}$ configurations and corresponding focusing beam focusing effects when the dimension of an electrode segment A/D=1. Note that three electrode segments are shown, wherein the middle electrode segment is subjected to a positive $V_{Einzel}$ while the two adjacent electrode segments are grounded. Subplot (b) shows various geometrical configurations of the electrode segments (A/D) under constant $V_{Einzel}$ and corresponding beam focusing effects. Subplot (c) shows cascaded Einzel lens configurations of the electrode segments under the same $V_{Einzel}$ and the same total lengths of the electrode segments, and the corresponding beam focusing effects.

Figure 13D:
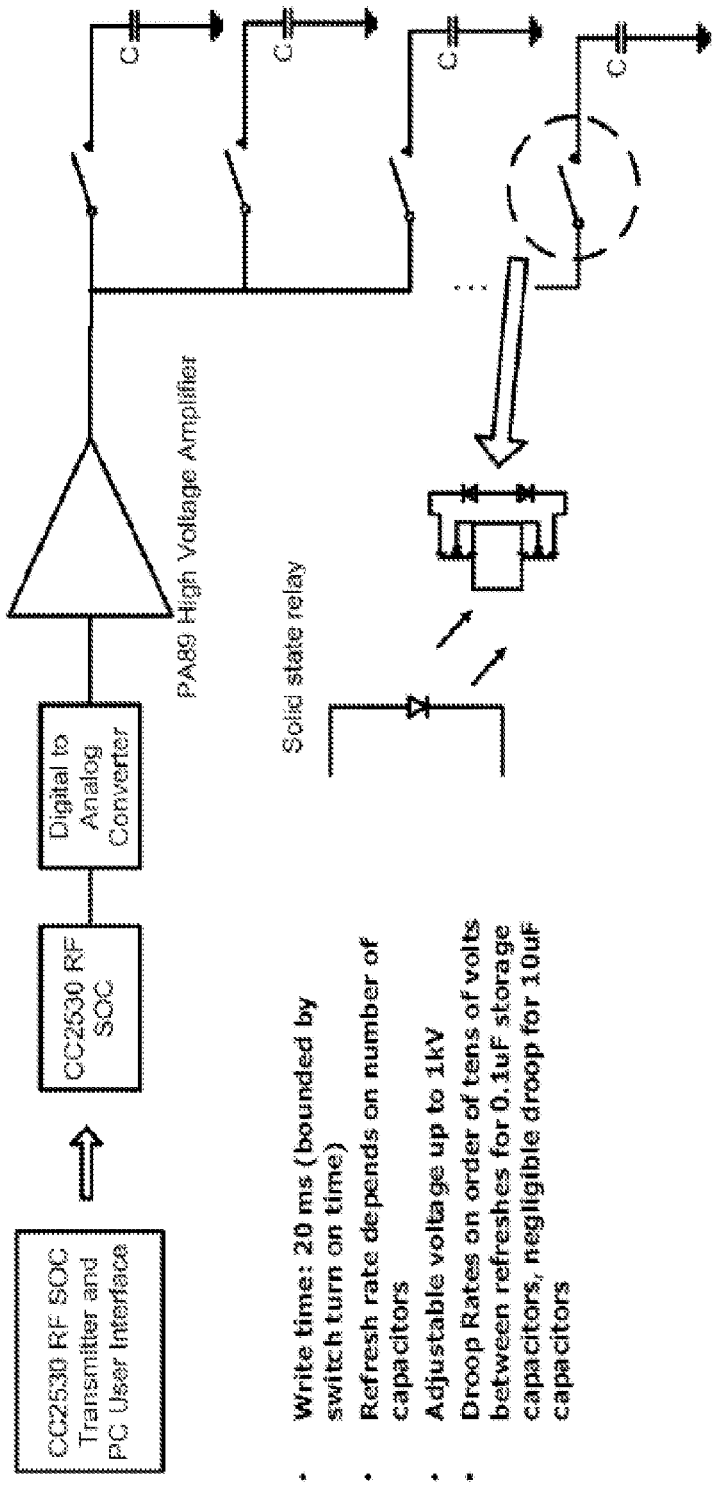
FIG. 13D shows a block diagram of DC focusing voltage ($V_{Einzel}$) generating circuit in accordance with some embodiments described herein
Figure 13E:
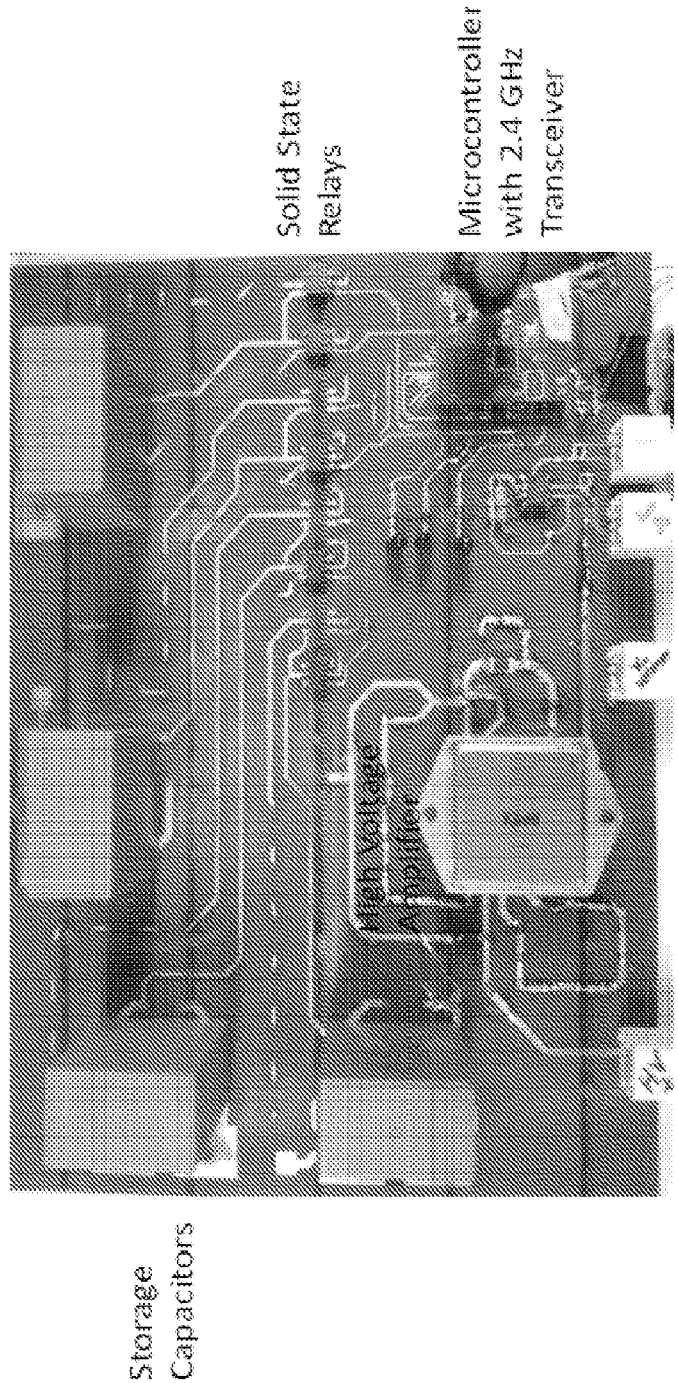
FIG. 13E shows a photo of a circuit board which implements the DC focusing voltage generating circuit of FIG. 13D in accordance with some embodiments described herein.

FIG. 13D shows a block diagram of DC focusing voltage ($V_{Einzel}$) generating circuit in accordance with some embodiments described herein. FIG. 13E shows a photo of a circuit board which implements the DC focusing voltage generating circuit of FIG. 13D in accordance with some embodiments described herein. In some embodiments, the above-described DC focusing voltage ($V_{Einzel}$) generating circuit can be integrated with RF amplifier 1304 and RF resonator 1308 in FIG. 13A on the same PCB-board. Hence, CPWR LINAC 1300 can be configured with dual functions of both charged particle (e.g., electrons) acceleration and for charged particle beam (e.g., electron beam) focusing. In addition to Einzel lens implementation, the electrodes can be configured for other beam shaping components such as electrostatic quadrupoles for modifying beam cross-sections.

Figure 13F:
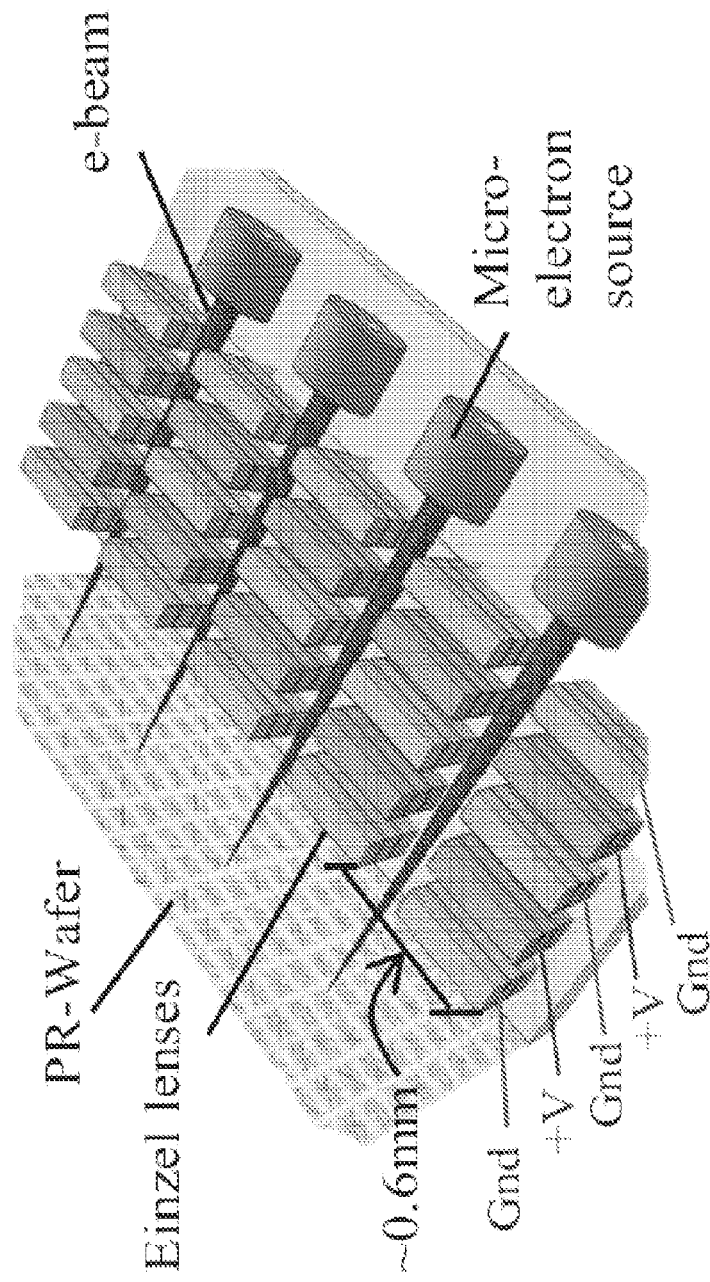
FIG. 13F illustrates using the disclosed CPWR LINACs to focus multiple electron beams (e-beams) in the application of e-beam lithography on a photoresist (PR)-covered wafer in accordance with some embodiments described herein.

FIG. 13F illustrates using the disclosed CPWR LINACs to focus multiple electron beams (e-beams) in the application of e-beam lithography on a PR-covered wafer in accordance with some embodiments described herein. Note that in the embodiment shown, an array of electrode blocks can be shared by two linear series of electrode blocks.

While the implementations described above use RF drive signal for the proposed LINAC device and DC drive signal for the proposed Einzel lens, some embodiments can use a combined RF and DC drive signal to drive either the proposed LINAC device or the proposed Einzel lens (i.e., a superposition of a DC signal and an RF signal using a bias tee for instance).

In some implementations, coplanar waveguides in an CPWR LINACs, such as RF resonator 1308, can be formed on FR4 PCB-boards, Rogers material, or sapphire, among other techniques, to facilitate planar RF signal propagation. In some implementations, planar films on planar substrates can be used to obtain microstrip, stripline, and coplanar wire structures in CPWR LINACs. In some embodiments, the quality factor of the proposed CPW resonators can be as high as 500 at frequencies up to 10 GHz, enabling high electric fields in such resonators. This field may be limited by the breakdown of the various dielectrics, which is ~30 kV/mm for materials like Rogers 4000 series. To test the CPWR LINAC, charged particles such as electrons of known energy are injected into the CPWR LINAC, where the coplanar waveguide driven electrode segments accelerate the charged particles. The X-rays generated as a result of Bremsstrahlung radiation from the accelerated particles can then be measured with a detector (e.g., a CdTe detector) for energy analysis.

In some implementations, a CPWR LINAC is designed for input electron energy of 5 keV in consideration of the minimum energy resolution threshold of the Amptek X-ray detector used in the experiments. In such implementations, the length of the first electrode segment in the linear series of electrode segments may be chosen to accommodate an initial injection energy of 5 keV. Once the length of the first electrode segment is chosen, the length of the subsequent electrode segments can be computed. For example, assuming the acceleration is 100 eV in each stage, the length of the fifth electrode segment is determined to be 2.08 cm. In some implementations, the gaps between the electrode segments are chosen to be 1 mm. Note that if the quality factor of the resonator is increased, the electric field in the gaps will increase, and the acceleration will be greater than 100 eV. As a result, the length of the consecutive electrode segments would need to be increased.

Another important design factor of the CPWR LINAC is the phase focusing. As the number of stages increases in the LINAC, some of the particles will no longer match the phase of the oscillating electric potential. Phase match between the accelerated particles and the RF field is often crucial in transferring energy to the particles along different stages of electrode segments. A simple method to maintain the phase focusing is to drive the accelerating particles at a slightly smaller phase than the phase that would yield maximum energy. This will slow down the velocity of the particles that are faster than the nominal velocity (i.e., the designed value) and accelerate particles that are travelling at a slower speed.

Figure 14:
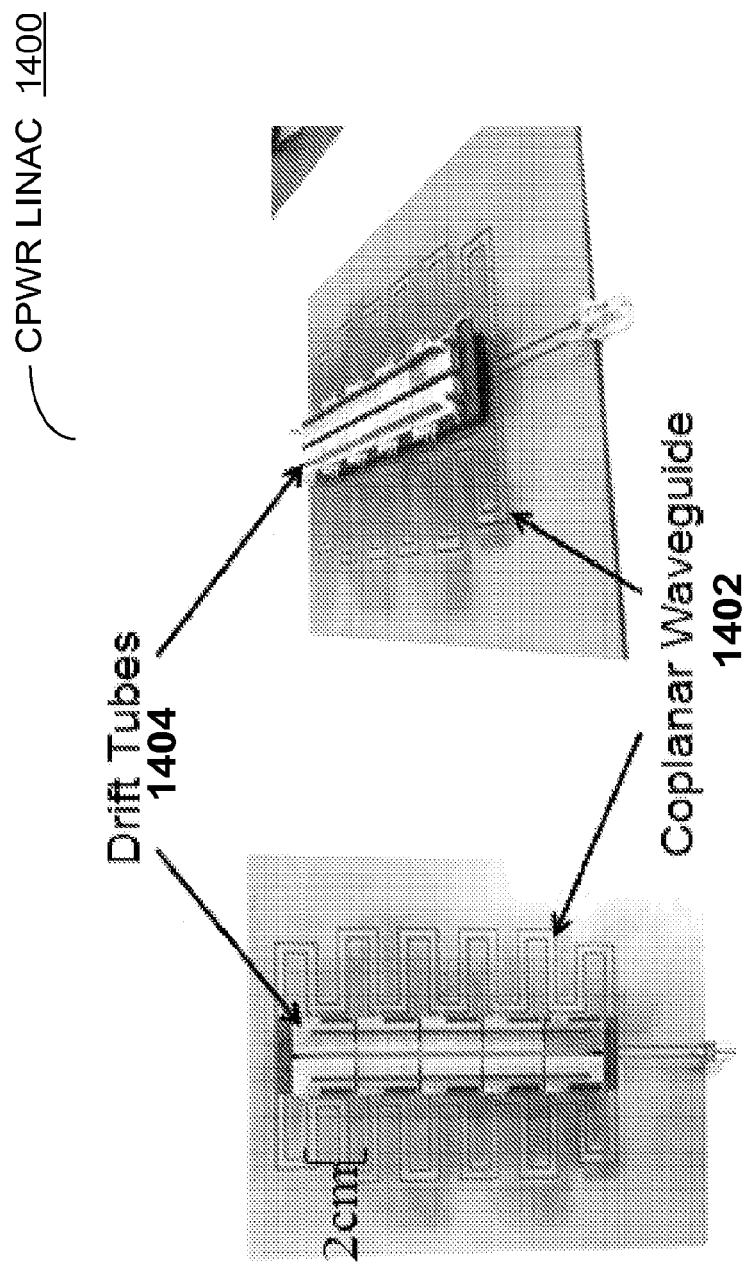
FIG. 14 shows two perspective views of a CPWR LINAC comprising a folded RF resonator designed as a coplanar waveguide integrated with electrode segments in accordance with some embodiments described herein.

In some embodiments, an optimal RF frequency for the device operation can be determined from the length of the electrode segments. For example, RF frequency of 1.04 GHz is computed to match the oscillation of the electric field to the transit time of the electrons as:

$$f = \frac{1}{2T}, \quad (22)$$

where f is the RF frequency and T is transit time of the electrons in a single electrode segment stage. The wavelength of the coplanar waveguide is 13 cm for the given frequency. Hence, resonant waveguide may be designed with a meander structure to meet the length of the required wavelength. FIG. 14 shows two perspective views of a CPWR LINAC 1400 comprising a folded RF resonator designed as a coplanar waveguide 1402 integrated with electrode segments 1404 in accordance with some embodiments described herein. To increase the acceleration of the designed LINAC, four different acceleration stages are use within a total length of 10 cm. To enhance the channel height of the electrode segments, four layers of silicon are stacked together and bonded using vacuum compatible conducting epoxy yielding a total height of 2 mm. The coplanar waveguide 1402 is built on a FR4 PCB-board.

In some implementations or applications, the electromagnetic field integrity and cross coupling considerations of the coplanar waveguide can make shorter electrode segments less desirable. In the example shown in FIG. 14, the electrode segments 1404 are raised above the coplanar waveguide 142 to minimize the electric field between the ground of the coplanar waveguide and the electric potential of the electrode segments.

Figure 15:
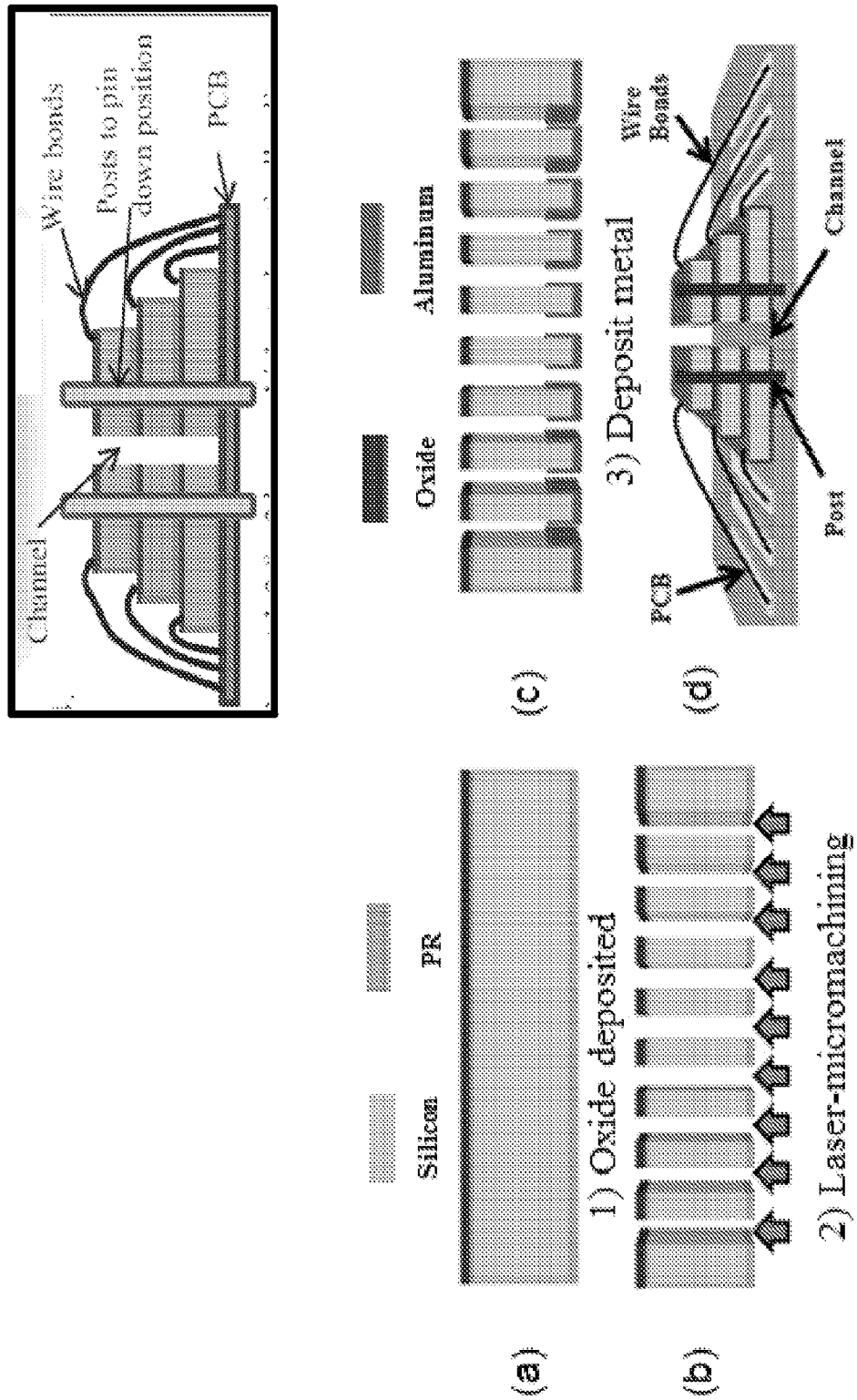
FIG. 15 illustrates using the described fabrication process to fabricate an on-chip Einzel lens in accordance with some embodiments described herein.

In some implementations, the series of electrode segments 1306 in LINAC 1300 can be fabricated using the following process. A commercially available laser micromachining tool (LPKF ProtoLaser U) is used for patterning electrodes and etching deep channels in four different silicon wafers. These wafers are then stacked and adhesively formed. The laser is then used to break the tethers that were included in the design to ensure alignment between the four layers and the PCB. FIG. 15 illustrates using the described fabrication process to fabricate a single stage of electrode segments 1306 in accordance with some embodiments described herein. As illustrated in FIG. 15, a 4 μm of oxide is deposited on the top side and photoresist (PR) layer is spun on the bottom side of the wafer in step (a). Next, silicon is cut by laser in step (b). PR layer is then stripped and aluminum is sputtered to realize conductive surfaces in step (c). Finally, the whole assembly is stacked on the PCB-board using posts, and the silicon/Al electrodes are wire-bonded to copper pads in step (d). The inset in FIG. 15 shows a more detailed cross-sectional view of the multiple-layer electrode segment. The channel between the two silicon/Al stacks is where the charged particles are contained. The multiple-layer stack creates a greater height of the channel which allows a better charged particle confinement within the electrode segment. In the embodiment shown in the inset, different silicon layers are coupled to separate wire bonds, thereby allowing them to receive independent drive signals.

One of the advantages of the described laser-micromachining and assembly process is its capability to create high aspect ratio structures with a maskless (direct-write) process, which contributes to cost effectiveness of this approach. While Deep Reactive Ion Etching (DRIE) of silicon is also a viable option offering better resolution and smaller side-wall roughness, the process choice can be made based partially on in-house availability of the laser-cutting tool as well as its high operational speed (i.e., shorter turnaround time) for the experimented pattern densities.

Figure 16:
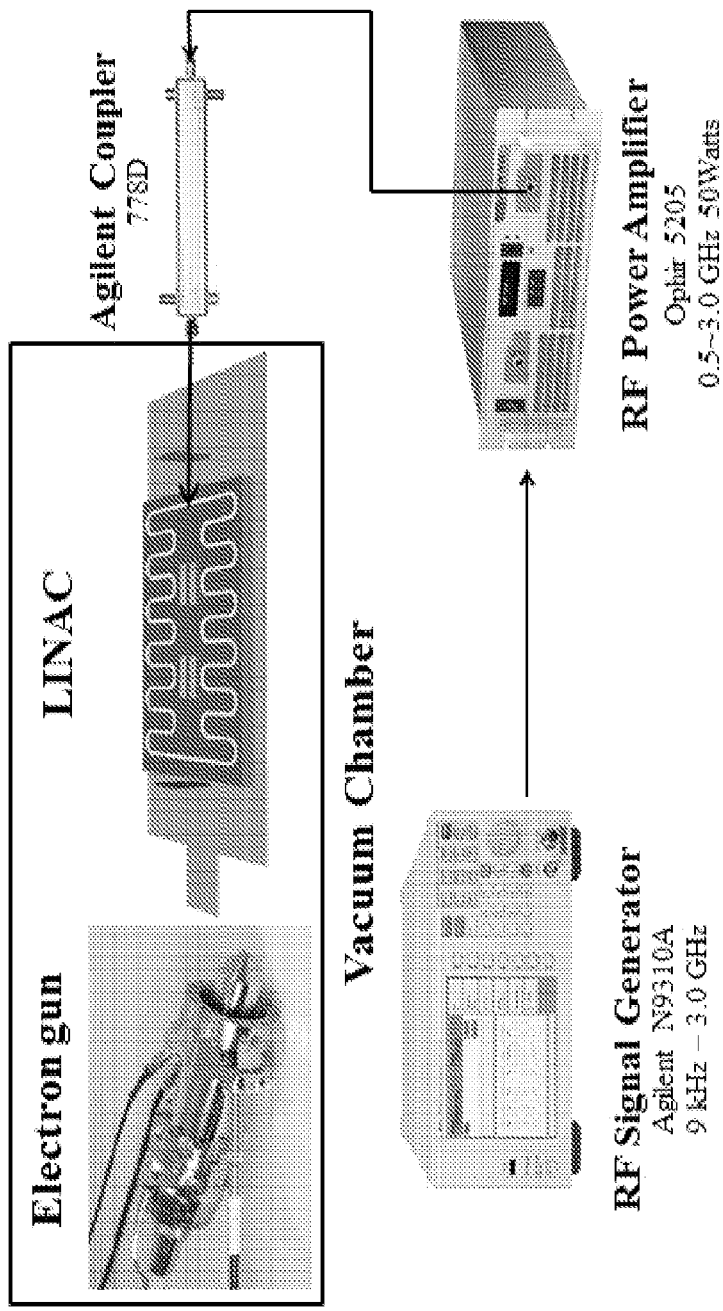
FIG. 16 shows the experiment setup, which includes an electron gun, the CPWR LINAC, external power-supplies in accordance with some embodiments described herein.

In some implementations, initial experiments of the CPWR LINAC device are performed in a vacuum chamber with RF and power feedthroughs at a pressure of 10-5 Torr. FIG. 16 shows the experiment setup, which includes an electron gun, the CPWR LINAC, external power-supplies in accordance with some embodiments described herein. As can be seen in FIG. 16, an RF signal generator (Agilent N9310A) is used to provide the oscillating field, which is connected to the RF power amplifier (Ophir 5205) for power amplification. The amplified signal is fed to the coplanar waveguide within LINAC through the bidirectional coupler (Agilent 778D). In some implementations, the electron beam from the electron gun (Kimball Physics EMG-4212) is slightly tilted at an angle from the center, which requires alignment prior to the experiment.

Figure 17:
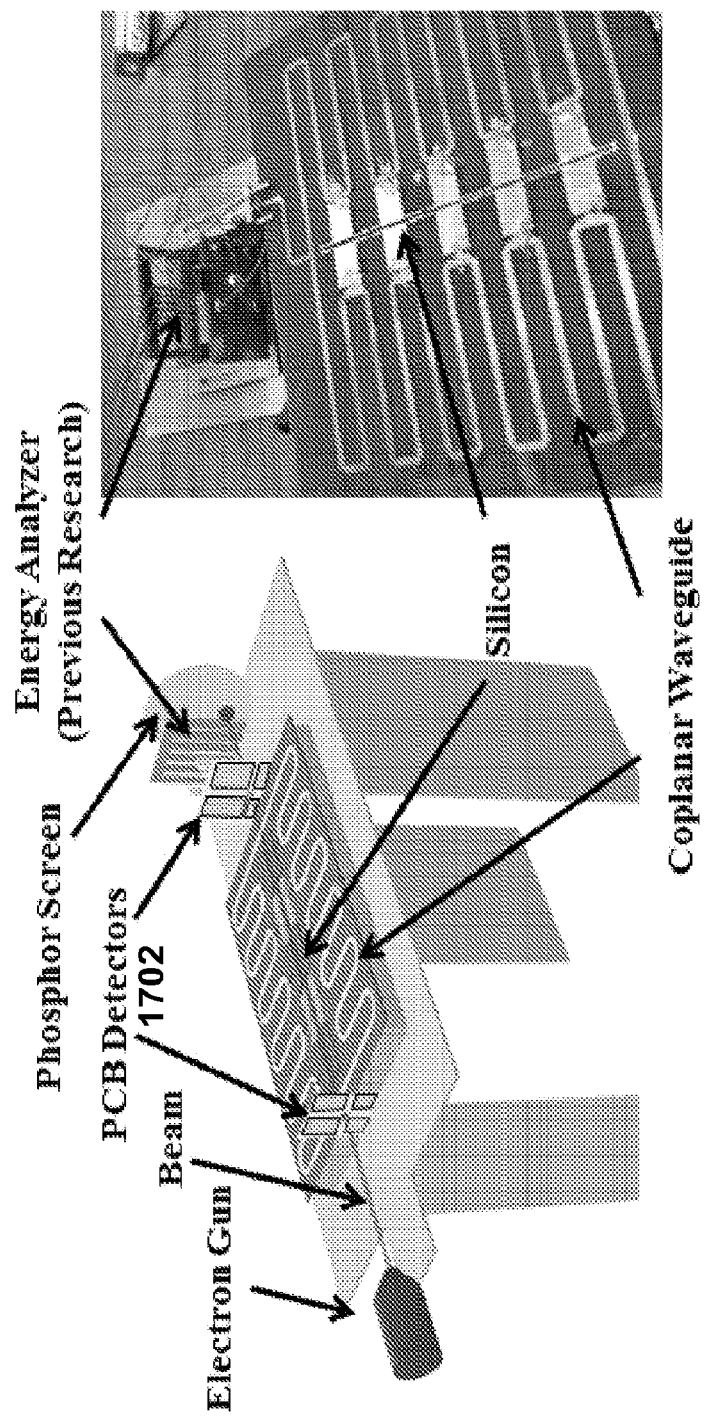
FIG. 17 illustrates a more detailed experiment setup in accordance with some embodiments described herein.

FIG. 17 illustrates a more detailed experiment setup in accordance with some embodiments described herein. More specifically, the left figure in FIG. 17 represents alignment with the phosphorous screen, while the right figure shows the alignment process where a laser is shined through the LINAC system. Simple copper electrode patterns defined on a PCB were used for electron detection using a current-meter (Keithley 2400). Two of these PCB detectors, which had their front copper isolated into four segments with a hole in the middle to let the electron beam pass through, were used. A deviation of the electron beam from the center would generate current in one of the four electrodes, which is detected by the current-meter. These 4-segmented PCB detectors were integrated into the LINAC device at the electron entrance and exit to ensure beam trajectory alignments which are shown in FIG. 17 as PCB detectors 1702.

After the alignment, the LINAC is installed inside the chamber for testing. 5 keV electrons are injected through the channel of the LINAC at a beam current of 1 µA. The particles accelerate as they pass through the four stages of the LINAC and collide with the copper plate to generate X-rays due to Bremsstrahlung radiation.

Figure 18:
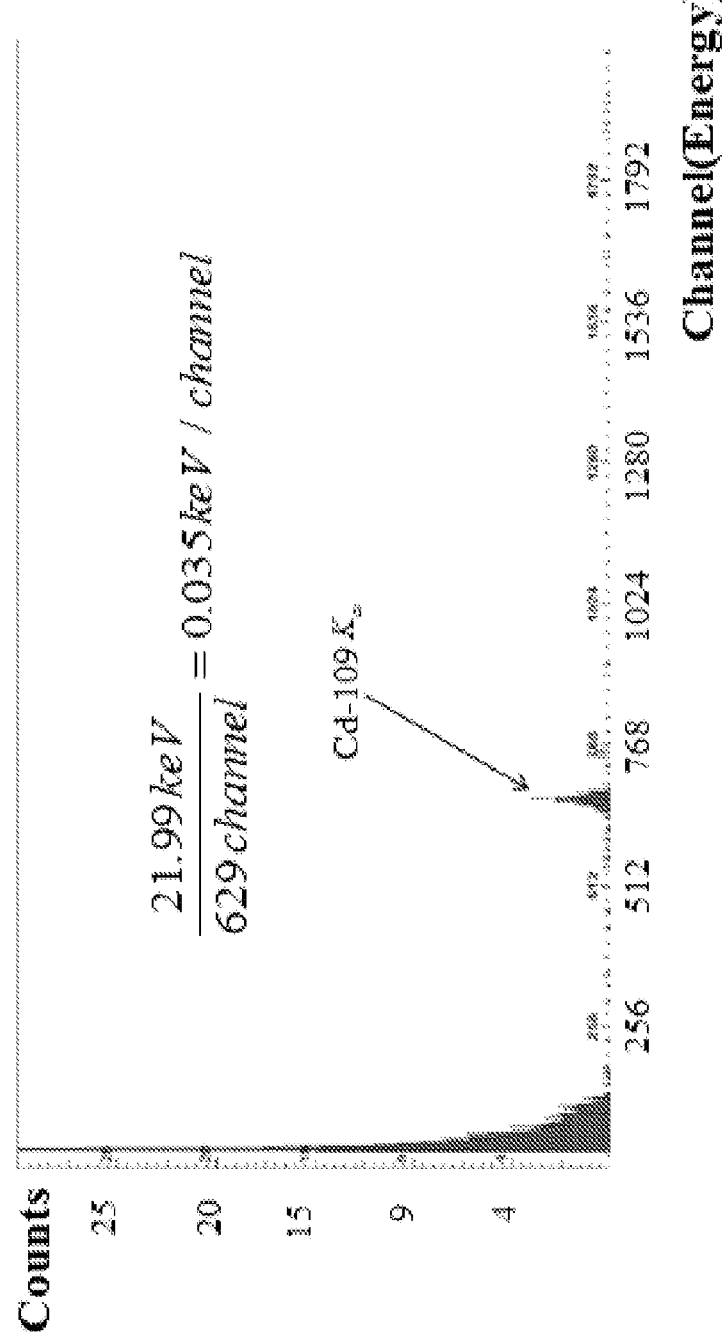
FIG. 18 shows Amptek CdTe diode detector calibration result in accordance with some embodiments described herein.

In some implementations, Amptek CdTe diode detector is used to analyze the X-rays generated from the LINAC. Prior to the LINAC experiment, the X-ray detector was calibrated using a known source of Cd-109. FIG. 18 shows Amptek CdTe diode detector calibration result in accordance with some embodiments described herein. The x-axis of the resulting graph from the X-ray detector is given as a number of channels, which represents the energy to be calibrated. The y-axis of the graph is the number of counts which is the quantity of the X-ray emission. One of the Cd-109 Kα emissions is expected to have energy of 22 keV. By observing the peak emission at channel 629, we obtained a calibration factor of 35 eV/channel as shown in FIG. 18.

After the X-ray detector calibration, the detector was tested with the electron gun. The energy of the electrons impinging on the copper plate was incremented from 4 keV to 7 keV in steps of 1 keV with a beam current of 1 µA. The Bremsstrahlung curve from the X-rays was observed to shift to the right as expected for higher energies. The peak of the 5 keV occurred at 2.8 keV, which also confirms the calibration made using Cd-109.

Figure 19:
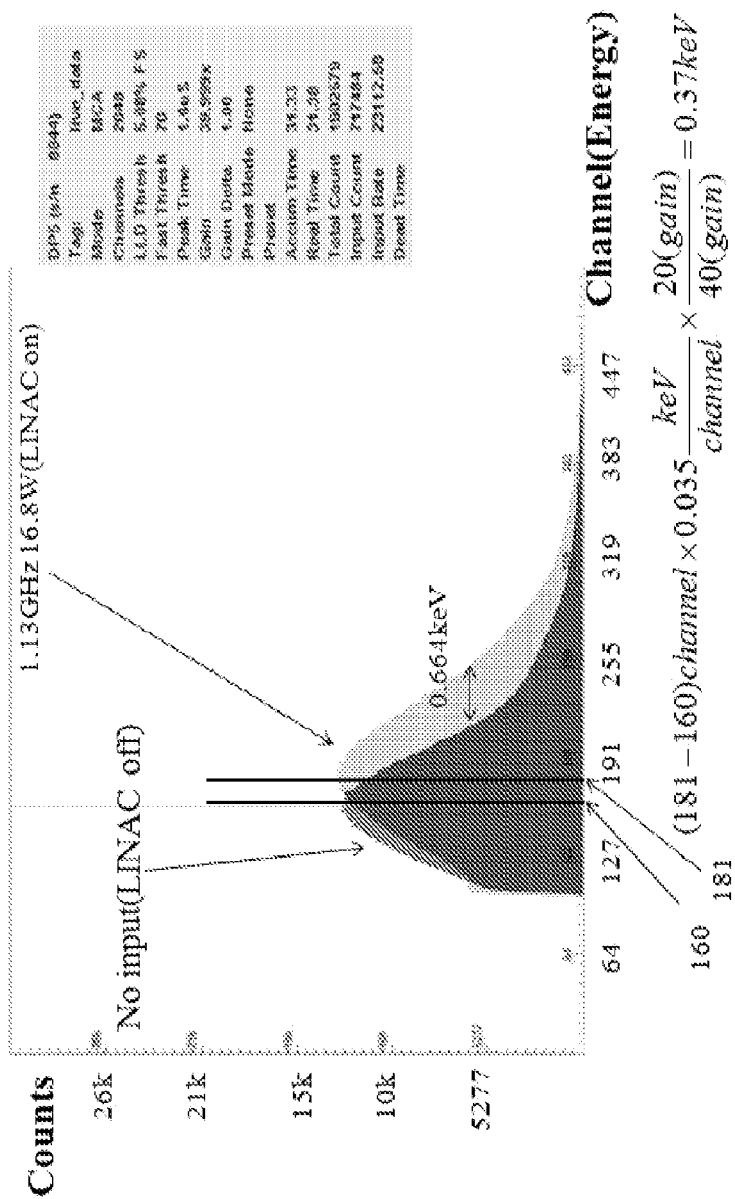
FIG. 19 shows the measured Bremsstrahlung curve with a beam current of 1 μA in accordance with some embodiments described herein.

After the calibration, the LINAC is tested inside the vacuum chamber. FIG. 19 shows the measured Bremsstrahlung curve with a beam current of 1 µA in accordance with some embodiments described herein. It can be seen that the difference between the two Bremsstrahlung peaks is 21. Using the calibration factor, this channel difference can be converted to an energy difference of 0.37 keV.

Hence, embodiments of a compact coplanar-waveguide-based LINAC were disclosed and its preliminary operation demonstrated. In some implementations, the fabricated compact LINAC system showed an acceleration of 0.37 keV for a 5 keV electron beam at a beam current of 1 µA. Further acceleration in the proposed LINAC structure can be obtained by feeding higher power through impedance matching between the power source and the coplanar waveguide of the resonator. Note that developing a custom X-band oscillator, RF amplifier, and integrating those at the PCB level with the coplanar waveguide can further reduce the size of the LINAC and will enable a LINAC system in the 10-cc scale.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A device for accelerating charged particles, comprising:
a radio frequency (RF) signal generator for generating an RF signal;
an RF resonator coupled to the RF signal generator and operable to generate a high-voltage RF drive signal based on the received RF signal; and
a linear series of electrode segments arranged to form a path for receiving and accelerating charged particles and coupled to the RF resonator to receive the high-voltage RF drive signal to accelerate received charged particles successively through the linear series of electrode segments, wherein each electrode segment of the linear series of electrode segments is driven by the high-voltage RF drive signal, and wherein the path formed by the linear series of electrode segments has a different, non-parallel direction from that of the received charged particles.

2. The device of claim 1, wherein the RF resonator is implemented as a coplanar waveguide.

3. The device of claim 2, wherein the coplanar waveguide is configured in a meander structure to match the wavelength of the RF resonator.

4. The device of claim 2, wherein the coplanar waveguide is formed on one of:
a printed circuit board (PCB);
Rogers material;
Alumina;
Sapphire; or
a ceramic substrate.

5. The device of claim 2, wherein the coplanar waveguide and the linear series of electrode segments are formed on a common planar platform.

6. The device of claim 2, wherein the coplanar waveguide is substantially parallel to the linear series of electrode segments.

7. The device of claim 2, wherein the linear series of electrode segments are raised above the coplanar waveguide to minimize the electric field between the ground of the coplanar waveguide and the electric potential of the linear series of electrode segments.

8. The device of claim 1, wherein the linear series of electrode segments are coupled to the RF resonator through a set of wire bonds.

9. The device of claim 1, wherein the linear series of electrode segments are coupled to the RF resonator through printed conductor wires or planar waveguides.

10. The device of claim 1, wherein the linear series of electrode segments are spaced by a set of gaps of a constant size.

11. The device of claim 1, wherein the linear series of electrode segments serves the function of traditional drift tubes in a linear particle accelerator (LINAC).

12. The device of claim 1, wherein each electrode segment in the linear series of electrode segments comprises a pair of parallel electrode blocks, and wherein the space between the pair of parallel electrode blocks is part of the path for receiving and accelerating the charged particles.

13. The device of claim 12, wherein each of the pair of parallel electrode blocks is a multi-layer stack comprising multiple silicon/metal-multilayer structures.

14. The device of claim 1, wherein the RF resonator generates the high-voltage RF drive signal by multiplying the amplitude of the received RF signal by a factor less than or equal to the quality (Q) factor of the RF resonator.

15. The device of claim 1, wherein the frequency of the RF signal is selected to match the transit time of the charged particles through a single electrode segment stage within the linear series of electrode segments.

16. The device of claim 1, wherein the path of the linear series of electrode segments is fabricated by a laser-micromachining process or a Deep Reactive Ion Etching (DRIE) process.

17. The device of claim 1, further comprising an RF amplifier coupled between the RF signal generator and the RF resonator for amplifying the RF signal.

18. The device of claim 1, wherein the linear series of electrode segments is further subjected to a DC bias voltage.

19. A LINAC for accelerating charged particles, comprising:
  a radio frequency (RF) signal generator for generating an RF signal;
  an RF resonator coupled to the RF signal generator and operable to generate a high-voltage RF drive signal based on the received RF signal; and
  a linear series of drift tubes for receiving and accelerating charged particles and coupled to the RF resonator to receive the high-voltage RF drive signal to accelerate received charged particles successively through the linear series of drift tubes, wherein each drift tube of the linear series of conventional drift tubes is driven by the high-voltage RF drive signal, and wherein the linear series of drift tubes are arranged to form a path to receive the charged particles in a direction different and non-parallel from that of the accelerated charged particles accelerated by drift tubes.

20. The LINAC of claim 19, wherein the RF resonator is implemented as a coplanar waveguide on a PCB.

21. The LINAC of claim 19, wherein the RF resonator generates the high-voltage RF drive signal by multiplying the amplitude of the received RF signal by a factor less than or equal to the quality (Q) factor of the RF resonator.

22. A device for accelerating charged particles, comprising:
  a radio frequency (RF) signal generator for generating an RF drive signal; and
  a linear series of electrode segments to form a path for receiving and accelerating charged particles and coupled to the RF resonator to receive the RF drive signal to accelerate received charged particles successively through the linear series of electrode segments, wherein each electrode segment of the linear series of electrode segments is driven by the RF drive signal, and wherein the linear series of electrode segments are micro-fabricated using a wafer technology, and wherein the path formed by the linear series of electrode segments has a different, non-parallel direction from that of the received charged particles.

* * * * *